(12) United States Patent
Yamaoka et al.

(10) Patent No.: US 10,529,780 B2
(45) Date of Patent: Jan. 7, 2020

(54) DISPLAY DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventors: Ryohei Yamaoka, Atsugi (JP); Satoshi Seo, Sagamihara (JP); Daiki Nakamura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 123 days.

(21) Appl. No.: 15/899,620

(22) Filed: Feb. 20, 2018

(65) Prior Publication Data

US 2018/0247981 A1    Aug. 30, 2018

(30) Foreign Application Priority Data

Feb. 28, 2017  (JP) ................... 2017-037256

(51) Int. Cl.
    *H01L 27/32*      (2006.01)
    *H01L 51/50*      (2006.01)
    *H01L 51/52*      (2006.01)

(52) U.S. Cl.
    CPC ...... *H01L 27/3209* (2013.01); *H01L 27/3206* (2013.01); *H01L 51/5056* (2013.01); *H01L 51/5072* (2013.01); *H01L 51/5203* (2013.01); *H01L 2251/558* (2013.01)

(58) Field of Classification Search
    None
    See application file for complete search history.

(56) References Cited

U.S. PATENT DOCUMENTS

| 8,789,968 B2 | 7/2014 | Ohsawa et al. |
| 9,088,006 B2 | 7/2015 | Yamazaki et al. |
| 9,343,691 B2 | 5/2016 | Sea et al. |
| 9,577,222 B2 | 2/2017 | Seo et al. |

(Continued)

FOREIGN PATENT DOCUMENTS

| JP | 2014-197522 A | 10/2014 |
| JP | 2016-039151 A | 3/2016 |

*Primary Examiner* — Gustavo Polo
(74) *Attorney, Agent, or Firm* — Robinson Intellectual Property Law Office; Eric J. Robinson

(57) ABSTRACT

A display device with a wide viewing angle is provided. A display device capable of displaying an image with a wide color gamut is provided. A display device includes a first light-emitting element, a second light-emitting element, and a third light-emitting element. The light-emitting elements each include a pair of electrodes and a light-emitting layer. One of the pair of electrodes includes a reflective electrode, and the other of the pair of electrodes includes a transflective electrode. The light-emitting layers of the light-emitting elements are different from each other. A first peak wavelength of the emission spectrum of the first light-emitting element is greater than or equal to 400 nm and less than or equal to 480 nm. A second peak wavelength of the emission spectrum of the second light-emitting element is greater than or equal to 580 nm and less than or equal to 700 nm. A third peak wavelength of the emission spectrum of the third light-emitting element is between the first peak wavelength and the second peak wavelength. The distance between the pair of electrodes of the first light-emitting element is longest and that of the second light-emitting element is second longest.

20 Claims, 18 Drawing Sheets

(56) References Cited

U.S. PATENT DOCUMENTS

| | | |
|---|---|---|
| 9,583,735 B2 | 2/2017 | Sea et al. |
| 9,627,648 B2 | 4/2017 | Yamazaki et al. |
| 9,837,478 B2 | 12/2017 | Ikeda et al. |
| 9,876,196 B2 | 1/2018 | Seo et al. |
| 2005/0142976 A1 | 6/2005 | Suzuki |
| 2006/0232202 A1 | 10/2006 | Matsuda et al. |
| 2007/0015429 A1 | 1/2007 | Maeda et al. |
| 2008/0203898 A1 | 8/2008 | Kobayashi |
| 2009/0115706 A1 | 5/2009 | Hwang et al. |
| 2009/0224661 A1 | 9/2009 | Nakayama |
| 2011/0198629 A1 | 8/2011 | Lee et al. |
| 2016/0299387 A1 | 10/2016 | Yamazaki et al. |
| 2017/0025444 A1 | 1/2017 | Hirakata |
| 2017/0155092 A1 | 6/2017 | Seo et al. |
| 2017/0279081 A1 | 9/2017 | Yamazaki et al. |
| 2017/0373036 A1 | 12/2017 | Yamazaki et al. |
| 2018/0012943 A1 | 1/2018 | Ikeda et al. |

FIG. 10A1
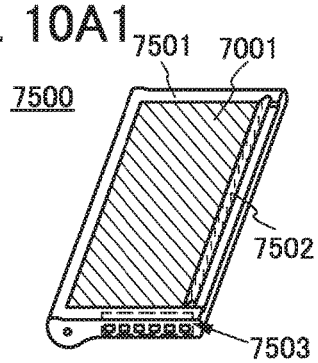
FIG. 10B
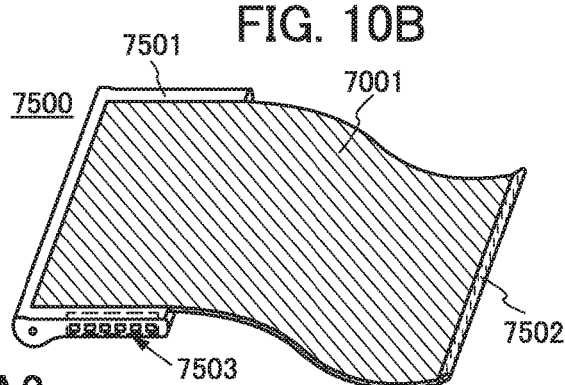
FIG. 10C
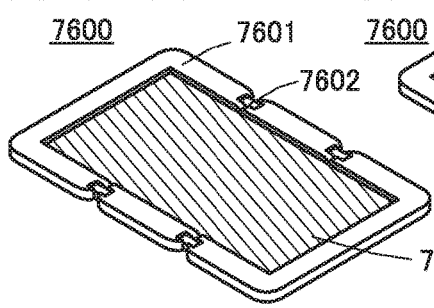
FIG. 10D
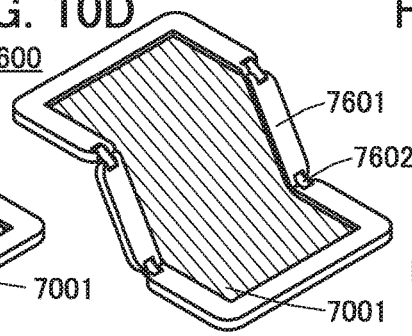
FIG. 10E
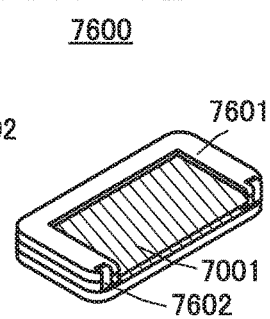
FIG. 10F
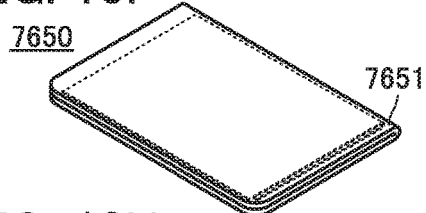
FIG. 10G
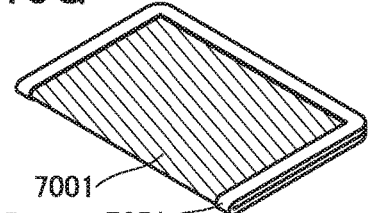
FIG. 10H
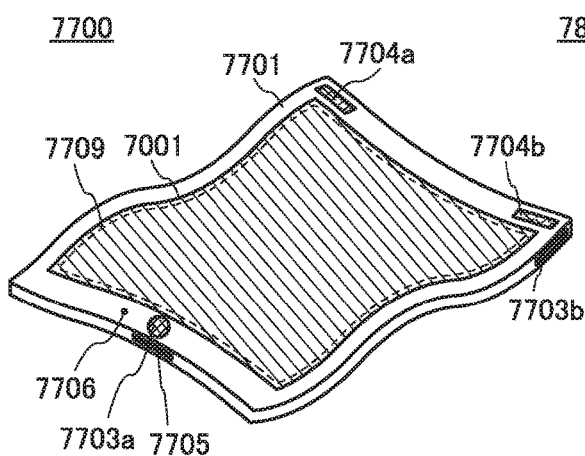
FIG. 10I
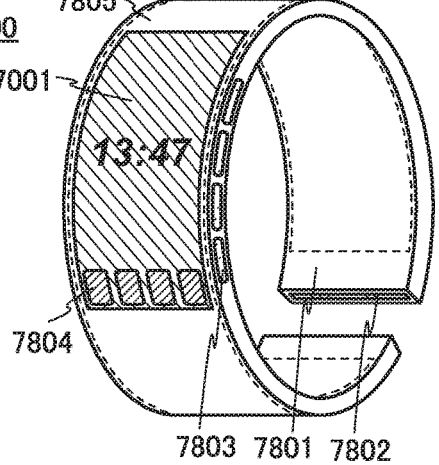

DISPLAY DEVICE, DISPLAY MODULE, AND ELECTRONIC DEVICE

BACKGROUND OF THE INVENTION

1. Field of the Invention

One embodiment of the present invention relates to a display device, a display module, and an electronic device.

2. Description of the Related Art

Note that one embodiment of the present invention is not limited to the above technical field. Examples of the technical field of one embodiment of the present invention include a semiconductor device, a display device, a light-emitting device, an electronic device, a lighting device, an input/output device (e.g., a touch panel), a method for driving any of them, and a method for manufacturing any of them.

Recent display devices have been expected to be applied to a variety of uses. Examples of uses for a large display device include a television device for home use (also referred to as a TV or a television receiver), digital signage, and a public information display (PID). A larger display region of a display device can provide more information at a time. In addition, a larger display region attracts more attention, so that the effectiveness of the advertisement is expected to be increased, for example.

Light-emitting devices including light-emitting elements have been developed as display devices. Light-emitting elements utilizing electroluminescence (hereinafter referred to as EL elements) have features such as ease of thinning and lightening, high-speed response to an input signal, and driving with a direct-current low voltage source; thus, application of the EL elements to display devices has been proposed.

In addition, application of an organic EL element to a flexible device has been proposed. Patent Document 1, for example, discloses a flexible light-emitting device to which an organic EL element is applied.

REFERENCE

Patent Document

[Patent Document 1] Japanese Published Patent Application No. 2014-197522

SUMMARY OF THE INVENTION

In view of various applications, display devices need to have high visibility not only when seen from the front but also when seen from the oblique direction. Display by the display device seen from the front is desirably not largely different from display by the display device seen from the oblique direction.

One object of one embodiment of the present invention is to provide a display device with a wide viewing angle. Another object of one embodiment of the present invention is to provide a display device capable of displaying an image with a wide color gamut.

Note that the descriptions of these objects do not disturb the existence of other objects. One embodiment of the present invention does not necessarily achieve all the objects. Other objects can be derived from the description of the specification, the drawings, and the claims.

One embodiment of the present invention is a display device including a first light-emitting element, a second light-emitting element, and a third light-emitting element. The first light-emitting element, the second light-emitting element, and the third light-emitting element each include a pair of electrodes and a light-emitting layer between the pair of electrodes. One of the pair of electrodes includes a reflective electrode. The other of the pair of electrodes includes a transflective electrode. The light-emitting layers of the first light-emitting element, the second light-emitting element, and the third light-emitting element are different from each other. A first peak wavelength of the emission spectrum of the first light-emitting element is greater than or equal to 400 nm and less than or equal to 480 nm. A second peak wavelength of the emission spectrum of the second light-emitting element is greater than or equal to 580 nm and less than or equal to 700 nm. A third peak wavelength of the emission spectrum of the third light-emitting element is between the first peak wavelength and the second peak wavelength. The first light-emitting element is preferably thicker than the second light-emitting element, and the second light-emitting element is preferably thicker than the third light-emitting element. Alternatively, the distance between the pair of electrodes of the first light-emitting element is preferably longer than the distance between the pair of electrodes of the second light-emitting element, and the distance between the pair of electrodes of the second light-emitting element is preferably longer than the distance between the pair of electrodes of the third light-emitting element.

The difference between the thickness of the first light-emitting element and the thickness of the second light-emitting element is preferably greater than or equal to 40 nm and less than or equal to 90 nm. Alternatively, the difference between the distance between the pair of electrodes of the first light-emitting element and the distance between the pair of electrodes of the second light-emitting element is preferably greater than or equal to 40 nm and less than or equal to 90 nm.

The first light-emitting element, the second light-emitting element, and the third light-emitting element each preferably include a hole-transport layer between the pair of electrodes. Here, the hole-transport layer of the first light-emitting element is preferably thicker than the hole-transport layer of the second light-emitting element, and the hole-transport layer of the first light-emitting element is preferably thicker than the hole-transport layer of the third light-emitting element.

The first light-emitting element, the second light-emitting element, and the third light-emitting element each preferably include a transparent electrode between the reflective electrode and the light-emitting layer. The transparent electrode of the first light-emitting element is preferably thicker than the transparent electrode of the second light-emitting element, and the transparent electrode of the first light-emitting element is preferably thicker than the transparent electrode of the third light-emitting element. Here, the first light-emitting element, the second light-emitting element, and the third light-emitting element each preferably include a hole-injection layer and a hole-transport layer between the transparent electrode and the light-emitting layer. The first light-emitting element, the second light-emitting element, and the third light-emitting element preferably share the same hole-injection layer. Similarly, the first light-emitting element, the second light-emitting element, and the third light-emitting element preferably share the same hole-transport layer. That is, the hole-injection layer and the hole-transport layer are preferably shared by the first light-emitting element, the second light-emitting element, and the third light-emitting element.

The first light-emitting element, the second light-emitting element, and the third light-emitting element each preferably include an electron-transport layer between the pair of electrodes. The first light-emitting element, the second light-emitting element, and the third light-emitting element preferably share the same electron-transport layer. That is, the electron-transport layer is preferably shared by the first light-emitting element, the second light-emitting element, and the third light-emitting element.

A chromaticity difference Δu'v' on the CIE 1976 chromaticity coordinates (u',v' chromaticity coordinates) between the chromaticity of light from the second light-emitting element in the front direction and the chromaticity of light from the second light-emitting element in a direction inclined 60° from the front is preferably less than or equal to 0.05. Similarly, a chromaticity difference Δu'v' on the CIE 1976 chromaticity coordinates between the chromaticity of light from the first or third light-emitting element in the front direction and the chromaticity of light from the first or third light-emitting element in a direction inclined 60° from the front is preferably less than or equal to 0.05. Moreover, the inclination is not limited to 60°, and it is preferable that the same can be applied to an inclination of 30°, 40°, 50°, 70°, or 80°.

A chromaticity difference Δu'v' on the CIE 1976 chromaticity coordinates between the chromaticity of white in the front direction and the chromaticity of white in a direction inclined 60° from the front is preferably less than or equal to 0.05 when white display is performed by the first light-emitting element, the second light-emitting element, the third light-emitting element. Moreover, the inclination is not limited to 60°, and it is preferable that the same can be applied to the inclination of 30°, 40°, 50°, 70°, or 80°. Note that in this specification and the like, white display can be performed under, for example, a D65 standard illuminant, and the luminance at this time is preferably higher than or equal to 10 cd/m$^2$ and lower than or equal to 300 cd/m$^2$.

In the case where the relative luminance in a direction inclined 30° from the front with respect to front luminance is defined as a first relative luminance and the relative luminance in a direction inclined 60° from the front with respect to the front luminance is defined as a second relative luminance, the first relative luminance of the second light-emitting element is preferably higher than the first relative luminance of the first light-emitting element, and the second relative luminance of the second light-emitting element is preferably higher than the second relative luminance of the first light-emitting element.

The light-emitting layer of the first light-emitting element, the light-emitting layer of the second light-emitting element, and the light-emitting layer of the third light-emitting element are preferably separated from each other.

Another embodiment of the present invention is a display module that includes a display device with one of the configurations described above. The display module has a connector such as a flexible printed circuit (FPC) board or a tape carrier package (TCP) connected thereto, or an IC is implemented on the display module with a method such as a chip on glass (COG) method or a chip on film (COF) method.

Another embodiment of the present invention is an electronic device including the above display module and at least one of an antenna, a battery, a housing, a camera, a speaker, a microphone, and an operation button.

According to one embodiment of the present invention, a display device with a wide viewing angle can be provided. According to one embodiment of the present invention, a display device capable of displaying an image with a wide color gamut can be provided.

Note that the descriptions of these effects do not disturb the existence of other effects. One embodiment of the present invention does not necessarily have all the effects. Other effects can be derived from the description of the specification, the drawings, and the claims.

BRIEF DESCRIPTION OF THE DRAWINGS

In the accompanying drawings:

FIGS. 10A1, 10A2, and 10B to 10I illustrate examples of an electronic device;

DETAILED DESCRIPTION OF THE INVENTION

Figure 1A:
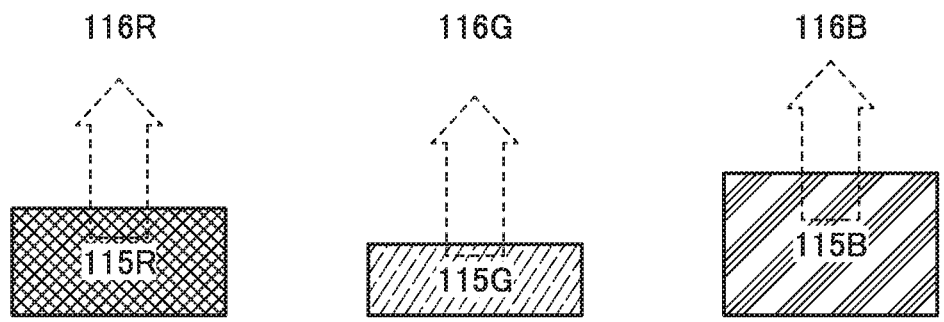
FIGS. 1A to 1C illustrate examples of light-emitting elements of a display device.

Embodiments are described in detail with reference to the drawings. Note that the present invention is not limited to the following description. It is readily appreciated by those skilled in the art that modes and details of the present invention can be modified in various ways without departing from the spirit and scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

The position, size, range, or the like of each component illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". In addition, the term "insulating film" can be changed into the term "insulating layer".

Embodiment 1

In this embodiment, a display device of one embodiment of the present invention will be described with reference to FIGS. 1A to 1C, FIGS. 2A and 2B, FIGS. 3A to 3E, FIGS. 4A to 4C, FIG. 5, FIGS. 6A to 6C, FIGS. 7A to 7C, and FIGS. 8A to 8C.

A display device of this embodiment includes a first light-emitting element, a second light-emitting element, and a third light-emitting element. The first light-emitting element, the second light-emitting element, and the third light-emitting element each include a pair of electrodes and a light-emitting layer between the pair of electrodes.

The first light-emitting element, the second light-emitting element, and the third light-emitting element each have a micro resonator (microcavity) structure. One of the pair of electrodes of each light-emitting element is a reflective electrode, and the other is a transflective electrode. When the wavelength of light emitted from the light-emitting layer is $\lambda$, the optical length between the pair of electrodes is preferably adjusted to around $m\lambda/2$ (m is a natural number).

As a coloring method for the display device of this embodiment, a separate coloring method is used. The light-emitting layer of the first light-emitting element, that of the second light-emitting element, and that of the third light-emitting element are different from each other. The light-emitting layer of the first light-emitting element, that of the second light-emitting element, and that of the third light-emitting element are preferably separated from each other. Note that when the resolution of the display device is high, the light-emitting layer of one light-emitting element partly overlaps with that of another light-emitting element in some cases. In this specification and the like, separation of light-emitting layers from each other does not necessarily mean spatial separation between the light-emitting layers and sometimes means electrical insulation from each other.

A first peak wavelength of the emission spectrum of the first light-emitting element is greater than or equal to 400 nm and less than or equal to 480 nm. The first light-emitting element is, for example, a light-emitting element that emits blue light.

A second peak wavelength of the emission spectrum of the second light-emitting element is greater than or equal to 580 nm and less than or equal to 700 nm. The second light-emitting element is, for example, a light-emitting element that emits red light.

A third peak wavelength of the emission spectrum of the third light-emitting element is between the first wavelength and the second wavelength. The third light-emitting element is, for example, a light-emitting element that emits green or yellow light.

The display device of this embodiment is characterized by the thickness of each light-emitting element. Specifically, the first light-emitting element is thicker than the second light-emitting element, and the second light-emitting element is thicker than the third light-emitting element. That is, the distance between the pair of electrodes of the first light-emitting element is longer than that of the second light-emitting element, and the distance between the pair of electrodes of the second light-emitting element is longer than that of the third light-emitting element. With such a structure, a color shift is hardly caused between when the display device is seen from the front and when the display device is seen from the oblique direction. Therefore, a display device with a wide viewing angle can be obtained.

For example, when the optical lengths between the pairs of electrodes of the first to third light-emitting elements are the same multiple (i.e., values of m in $m\lambda/2$ described above of the light-emitting elements are the same), a reduction in luminance, which depends on the angle, of each of the second and third light-emitting elements with high luminosity is greater than that of the first light-emitting element. Thus, the viewing angle dependence of the chromaticity of white is large. On the contrary, in the structure of one embodiment of the present invention, the luminance reduction ratio in each of the second and third light-emitting elements is lower than that in the first light-emitting element, whereby the viewing angle dependence of the chromaticity of white can be reduced. Specifically, the optical length between the pair of electrodes of the first light-emitting element preferably corresponds to 1 wavelength (m=2) and that of each of the second and third light-emitting elements preferably corresponds to ½ wavelength (m=1).

A chromaticity difference $\Delta u'v'$ on the CIE 1976 chromaticity coordinates between light from each light-emitting element in the front direction and light from each light-emitting element in the oblique direction (direction in which the absolute value of an angle from the front is greater than 0° and less than 90°) is preferably less than or equal to 0.05. Specifically, a chromaticity difference $\Delta u'v'$ between light from each light-emitting element in the front direction and light from each light-emitting element in a direction inclined in the range of 30° to 60° (preferably 30° to 80°) from the front is preferably less than or equal to 0.05.

In the case where white display is performed by the first to third light-emitting elements, a chromaticity difference $\Delta u'v'$ on the CIE 1976 chromaticity coordinates between the chromaticity of white in the front direction and the chromaticity of white in the oblique direction (direction in which the absolute value of an angle from the front is greater than 0° and less than 90°) is preferably less than or equal to 0.05. Specifically, a chromaticity difference $\Delta u'v'$ between the chromaticity of white in the front direction and the chromaticity of white in a direction inclined in the range of 30° to 60° (preferably 30° to 80°) from the front is preferably less than or equal to 0.05.

In the case where the relative luminance in a direction inclined 30° from the front with respect to front luminance is defined as a first relative luminance and the relative luminance in a direction inclined 60° from the front with respect to the front luminance is defined as a second relative luminance, the first relative luminance of the second light-emitting element is preferably higher than that of the first light-emitting element, and the second relative luminance of the second light-emitting element is preferably higher than that of the first light-emitting element.

When the magnitude relation between the relative luminance of the first light-emitting element and the relative luminance of the second light-emitting element is inverted due to a change in the viewing angle of the display device, the chromaticity of white may be largely changed depending on the viewing angle. Therefore, the magnitude relation between the relative luminance of the first light-emitting element and the relative luminance of the second light-emitting element is preferably not changed in a direction inclined in the range of 30° to 60° (preferably 30° to 80°) from the front. The same can be applied to the magnitude relation between the first light-emitting element and the third light-emitting element and the magnitude relation between the second light-emitting element and the third light-emitting element.

The display device of this embodiment has a small viewing angle dependence; thus, even when the display device is seen from the oblique direction, a reduction in contrast and a change in chromaticity, which depend on the angle, are small. Thus, the display device can have high visibility not only when seen from the front but also when seen from the oblique direction. For example, even when a plurality of viewers see the display device of this embodiment from various angles at the same time, information displayed on the display device can be recognized by the viewers. Moreover, even when a flexible display is seen in a bent state, high visibility can be obtained. The display device of this embodiment can be used for various applications such as a display portion of a portable electronic device, a display portion of a personal electronic device, and a display portion of a large screen.

The display device can have a structure in which subpixels of three colors of red (R), green (G), and blue (B) express one color, a structure in which subpixels of four colors of R, G, B, and white (W) express one color, a structure in which subpixels of four colors of R, G, B, and yellow (Y) express one color, or the like. There is no particular limitation on the color element and colors other than R, G, B, W, and Y (e.g., cyan or magenta) may be used.

Hereinafter, the display device of this embodiment and the light-emitting element of the display device will be specifically described.

<Structure Example 1 of Light-Emitting Element>

Light-emitting elements of a display device in which subpixels of three colors of red (R), green (G), and blue (B) express one color will be described with reference to FIGS. 1A to 1C.

FIG. 1A illustrates a light-emitting element 115R that emits red light 116R, a light-emitting element 115G that emits green light 116G, and a light-emitting element 115B that emits blue light 116B.

The emission spectrum of the light-emitting element 115B has a first peak wavelength in the range of 400 nm to 480 nm, the emission spectrum of the light-emitting element 115R has a second peak wavelength in the range of 580 nm to 700 nm, and the emission spectrum of the light-emitting element 115G has a third peak wavelength, which is longer than the first peak wavelength and shorter than the second peak wavelength.

The light-emitting element 115B is thicker than the light-emitting element 115R, and the light-emitting element 115R is thicker than the light-emitting element 115G.

The difference between the thickness of the light-emitting element 115R and the thickness of the light-emitting element 115B is preferably greater than or equal to 40 nm and less than or equal to 90 nm, more preferably greater than or equal to 40 nm and less than or equal to 75 nm. As the difference between the thicknesses of the two elements becomes small, the two elements each emit light with favorable chromaticity.

Figure 1B:
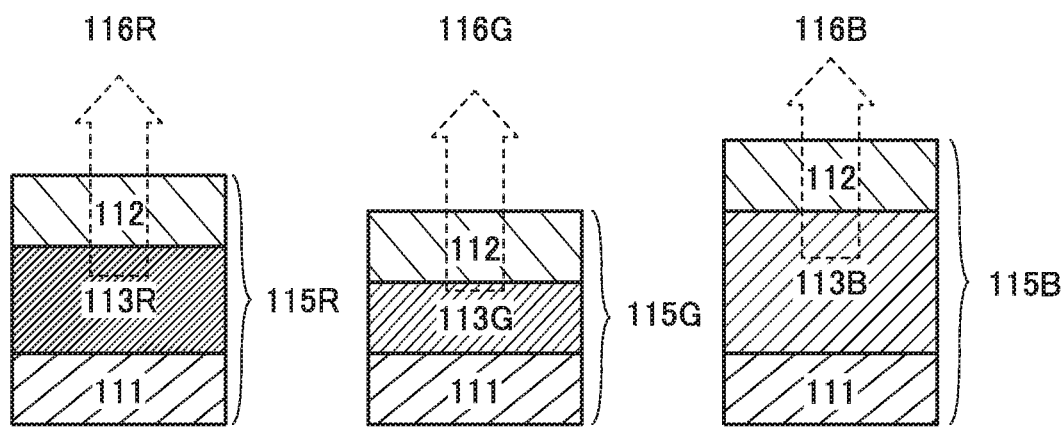

FIG. 1B illustrates structure examples of the light-emitting elements. The light-emitting elements each include an EL layer between a pair of electrodes. The light-emitting element 115R includes an EL layer 113R between a first electrode 111 and a second electrode 112. The light-emitting element 115G includes an EL layer 113G between the first electrode 111 and the second electrode 112. The light-emitting element 115B includes an EL layer 113B between the first electrode 111 and the second electrode 112.

The first electrode 111 serves as an anode. The second electrode 112 serves as a cathode.

The first electrode 111 is a reflective electrode, and the second electrode 112 is a transflective electrode. With a microcavity structure, light emitted from the EL layer can be resonated between the electrodes and light obtained through the second electrode 112 can be intensified.

Although this structure example describes the case where the EL layer emits light to the second electrode 112 side, the EL layer may emit light to the first electrode 111 side. Specifically, when the second electrode 112 is a reflective electrode and the first electrode 111 is a transflective electrode, light can be emitted to the first electrode 111 side.

Materials, thicknesses, and the like of the pairs of electrodes of the three light-emitting elements illustrated in FIG. 1B can be the same. Accordingly, the manufacturing cost of the display device can be reduced and the manufacturing process of the display device can be simplified.

In FIG. 1B, the distance between the pair of electrodes of each light-emitting element corresponds to the thickness of the EL layer. The EL layer 113B is thicker than the EL layer 113R, and the EL layer 113R is thicker than the EL layer 113G.

The difference between the thickness of the EL layer 113R and the thickness of the EL layer 113B is preferably greater than or equal to 40 nm and less than or equal to 90 nm, more preferably greater than or equal to 40 nm and less than or equal to 75 nm. As the difference between the thicknesses of the two EL layers becomes small, the two elements each emit light with favorable chromaticity.

The EL layer includes a light-emitting layer containing a light-emitting substance, so that fluorescence or phosphorescence of a desired emission color can be obtained. The EL layer can have a stacked structure.

The EL layers are formed to have structures according to their respective colors. When the EL layer has a stacked structure, at least one layer included in the EL layer differs between the light-emitting elements of a plurality of colors, and at least one layer included in the EL layer may be shared by the light-emitting elements of a plurality of colors.

Since the EL layers are formed to have structures according to their respective colors, the light-emitting elements can be easily formed to have appropriate thickness according to their respective colors.

The thickness of the EL layer 113R of the light-emitting element 115R is adjusted so that the optical length between the first electrode 111 and the second electrode 112 is set to an optical length that increases the emission intensity of red light. Similarly, the thickness of the EL layer 113G of the light-emitting element 115G is adjusted so that the optical length between the first electrode 111 and the second electrode 112 is set to an optical length that increases the emission intensity of green light. Furthermore, the thickness of the EL layer 113B of the light-emitting element 115B is adjusted so that the optical length between the first electrode 111 and the second electrode 112 is set to an optical length that increases the emission intensity of blue light.

Specifically, when the wavelength of light emitted from the light-emitting layer is $\lambda$, the thickness of each EL layer is preferably adjusted so that the optical length between the first electrode 111 and the second electrode 112 is around $m\lambda/2$ (m is a natural number).

When a certain metal film (e.g., a metal film containing a noble metal such as silver) is used as a reflective electrode, light extraction efficiency may be decreased by the influence of surface plasmon resonance (SPR). This is because light resonates with specific plasmon oscillation of the metal on a surface of the metal film and its vicinity, so that light having a wavelength corresponding to the specific oscillation cannot be extracted. The shorter the optical length between the reflective electrode and a light-emitting region of the light-emitting layer is, the more likely such a phenomenon is to occur. Therefore, the following structure is preferably employed for an element in which the wavelength $\lambda$ of light emitted from a light-emitting layer is the shortest, in particular, a blue-light-emitting element including a metal film containing silver as a reflective electrode. Specifically, in FIG. 2A, the optical length between the first electrode 111 and a region where desired light is obtained (light-emitting region) of a light-emitting layer 123B is preferably adjusted to around $(2m'+1)\lambda/4$ (m' is a natural number). Here, the light-emitting region means a region where holes and electrons are recombined in the light-emitting layer.

By such optical adjustment, the spectrum of specific monochromatic light emitted from the light-emitting layer can be narrowed and light emission with high color purity can be obtained. In addition, a decrease in light extraction efficiency of the light-emitting element can be prevented and power consumption of the display device can be reduced.

Note that the optical length between the first electrode 111 and the second electrode 112 is, to be exact, represented by the product of a refractive index and the distance from a reflective region in the first electrode 111 to a reflective region in the second electrode 112. However, it is difficult to exactly determine the reflective regions in the first electrode 111 and the second electrode 112; thus, it is assumed that the above effect can be sufficiently obtained wherever the reflective regions may be set in the first electrode 111 and the second electrode 112.

Similarly, the optical length between the first electrode 111 and the light-emitting region of the light-emitting layer is, to be exact, represented by the product of a refractive index and the distance from the reflective region in the first electrode 111 to the light-emitting region of the light-emitting layer. However, it is difficult to exactly determine the reflective region in the first electrode 111 and the light-emitting region of the light-emitting layer; thus, it is assumed that the above effect can be sufficiently obtained wherever the reflective region may be set in the first electrode 111 and the light-emitting region may be set in the light-emitting layer.

For example, the optical length between the electrodes of each of the light-emitting elements 115R and 115G is preferably adjusted to ½ wavelength, and the optical length between the electrodes of the light-emitting element 115B is preferably adjusted to 1 wavelength.

Figure 1C:
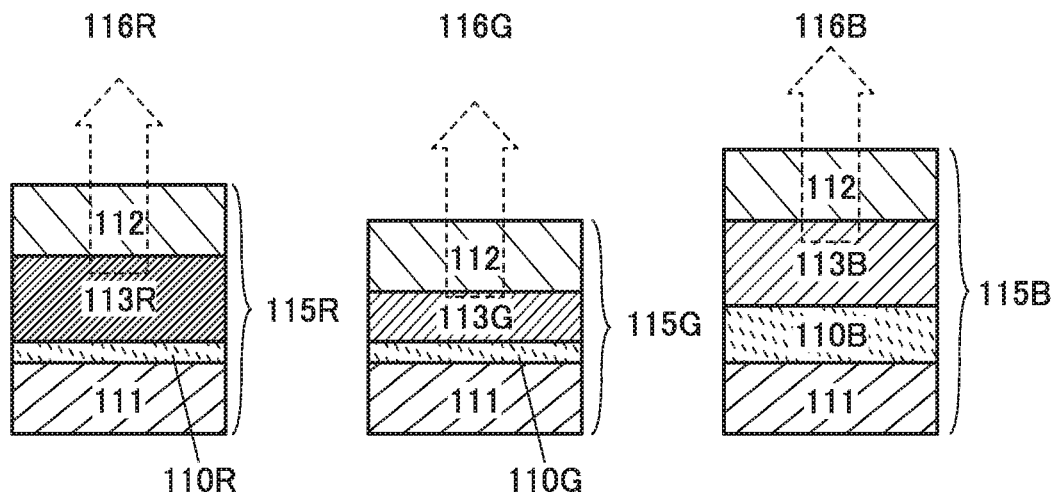

FIG. 1C illustrates structure examples of the light-emitting elements different from those in FIG. 1B. The light-emitting elements illustrated in FIG. 1C are different from those illustrated in FIG. 1B in each including an optical adjustment layer between the first electrode and the EL layer. The light-emitting element 115R includes an optical adjustment layer 110R between the first electrode 111 and the EL layer 113R. The light-emitting element 115G includes an optical adjustment layer 110G between the first electrode 111 and the EL layer 113G. The light-emitting element 115B includes an optical adjustment layer 110B between the first electrode 111 and the EL layer 113B.

In FIG. 1C, the distance between the pair of electrodes of each light-emitting element corresponds to the sum of the thicknesses of the EL layer and the optical adjustment layer. The sum of the thicknesses of the EL layer 113B and the optical adjustment layer 110B is greater than the sum of the thicknesses of the EL layer 113R and the optical adjustment layer 110R. The sum of the thicknesses of the EL layer 113R and the optical adjustment layer 110R is greater than the sum of the thicknesses of the EL layer 113G and the optical adjustment layer 110G.

The difference between the sum of the thicknesses of the EL layer 113B and the optical adjustment layer 110B and the sum of the thicknesses of the EL layer 113R and the optical adjustment layer 110R is preferably greater than or equal to 40 nm and less than or equal to 90 nm, more preferably greater than or equal to 40 nm and less than or equal to 75 nm. As the difference becomes small, the two elements each emit light with favorable chromaticity.

Optical adjustment can be performed by controlling the thicknesses of the EL layer and the optical adjustment layer.

As the optical adjustment layer, a conductive film which transmits visible light (transparent conductive film) can be used.

Next, the EL layer of the light-emitting element will be described more specifically. Note that a material and a manufacturing method of each layer of the light-emitting element will be described in detail in Embodiment 2.

<<Structure Example 1 of EL Layer>>

Figure 2A:
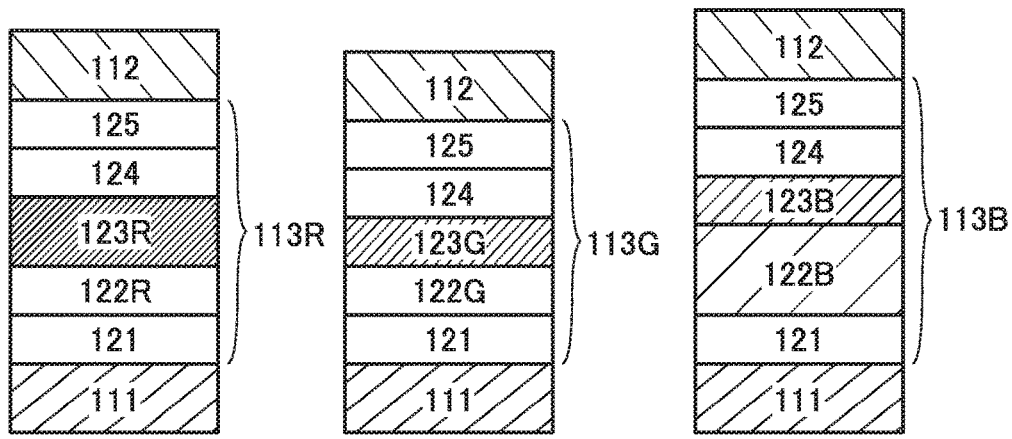
FIGS. 2A and 2B illustrate examples of light-emitting elements of a display device.

FIG. 2A illustrates structure examples of the EL layers of the three light-emitting elements illustrated in FIG. 1B. The EL layers each include a plurality of functional layers.

The EL layer 113R includes a hole-injection layer 121, a hole-transport layer 122R, a light-emitting layer 123R, an electron-transport layer 124, and an electron-injection layer 125.

The EL layer 113G includes the hole-injection layer 121, a hole-transport layer 122G, a light-emitting layer 123G, the electron-transport layer 124, and the electron-injection layer 125.

The EL layer 113B includes the hole-injection layer 121, a hole-transport layer 122B, the light-emitting layer 123B, the electron-transport layer 124, and the electron-injection layer 125.

As the number of functional layers shared by the light-emitting elements for different colors increases, the manufacturing cost of the EL layers can be reduced and the manufacturing process of the EL layers can be simplified. In the structure illustrated in FIG. 2A, the hole-injection layer 121, the electron-transport layer 124, and the electron-injection layer 125 are common in the light-emitting elements for different colors. In addition, optical adjustment can be performed by changing the thicknesses of the light-emitting layer and the hole-transport layer according to their respective colors. Note that the hole-transport layer 122R and the hole-transport layer 122G are preferably formed using the same material to have the same thickness.

In FIG. 2A, the hole-transport layer 122B is thicker than the hole-transport layers 122R and 122G.

<<Structure Example 2 of EL Layer>>

Figure 2B:
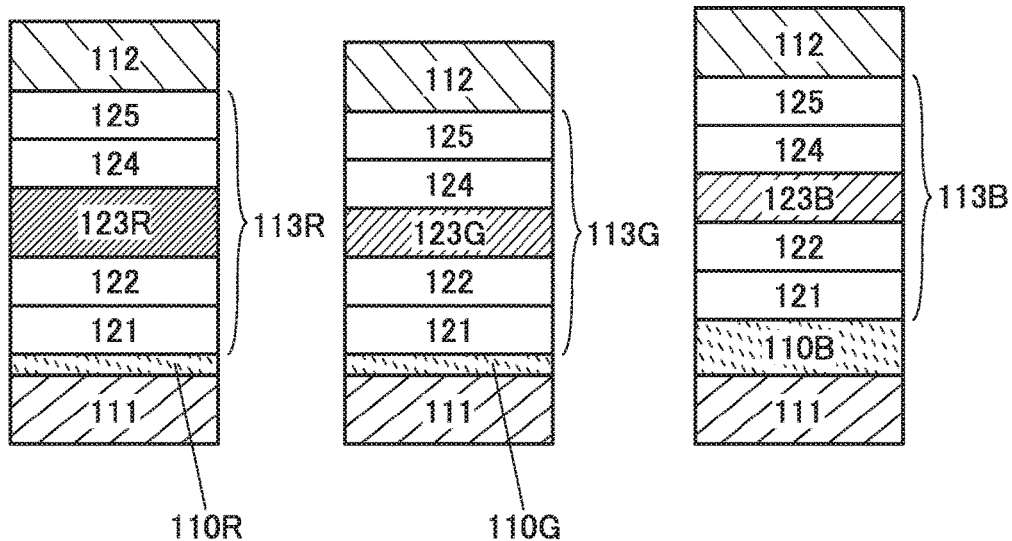

FIG. 2B illustrates structure examples of the EL layers of the three light-emitting elements illustrated in FIG. 1C.

The EL layer 113R includes the hole-injection layer 121, a hole-transport layer 122, the light-emitting layer 123R, the electron-transport layer 124, and the electron-injection layer 125.

The EL layer 113G includes the hole-injection layer 121, the hole-transport layer 122, the light-emitting layer 123G, the electron-transport layer 124, and the electron-injection layer 125.

The EL layer 113B includes the hole-injection layer 121, the hole-transport layer 122, the light-emitting layer 123B, the electron-transport layer 124, and the electron-injection layer 125.

In the structure illustrated in FIG. 2B, the hole-transport layer 122 is common in the light-emitting elements for different colors in addition to the hole-injection layer 121, the electron-transport layer 124, and the electron-injection layer 125. Optical adjustment can be performed by changing the thicknesses of the light-emitting layer and the optical adjustment layer according to their respective colors.

Here, the thicknesses of the optical adjustment layer 110R and the optical adjustment layer 110G illustrated in FIG. 2B are preferably substantially the same. When the thicknesses of the optical adjustment layer 110R and the optical adjustment layer 110G are substantially the same, the optical adjustment layer 110R and the optical adjustment layer 110G can be formed at a time. As a result, the number of manufacturing steps of the light-emitting element can be reduced.

The optical adjustment layer is preferably formed using an exposure technique using a multi-tone mask (a half-tone mask, a gray-tone mask, or the like). Thus, the number of the functional layers of the EL layer that are to be separately colored may be reduced. Furthermore, when the optical adjustment layers have different thicknesses according to their respective colors, the manufacturing cost of the light-emitting element may be reduced and the manufacturing process of the light-emitting element may be simplified as compared with the case where the more number of the functional layers of the EL layer are separately colored.

An example of manufacturing the optical adjustment layer will be described with reference to FIGS. 3A to 3E.

Figure 3A:
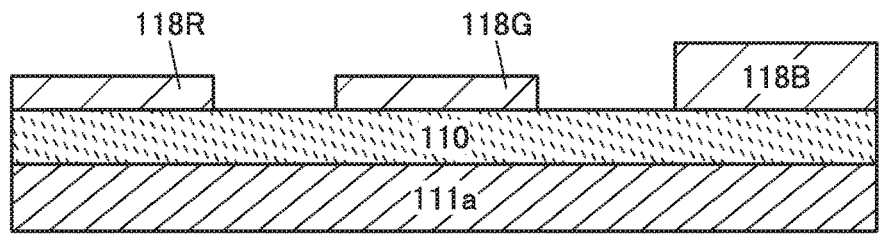
FIGS. 3A to 3E illustrate an example of a method for manufacturing optical adjustment layers of a display device.

First, a conductive film 111a to be the first electrodes 111 is formed, a transparent conductive film 110 to be the optical adjustment layers is formed, and resist films having different thicknesses according to their respective colors are formed using a multi-tone mask. Specifically, a resist film 118R and a resist film 118G are formed to have a first thickness in a portion where the optical adjustment layer 110R is to be formed and a portion where the optical adjustment layer 110G is to be formed, respectively, and a resist film 118B is formed to have a second thickness, which is larger than the first thickness, in a portion where the optical adjustment layer 110B is to be formed (FIG. 3A).

Figure 3B:
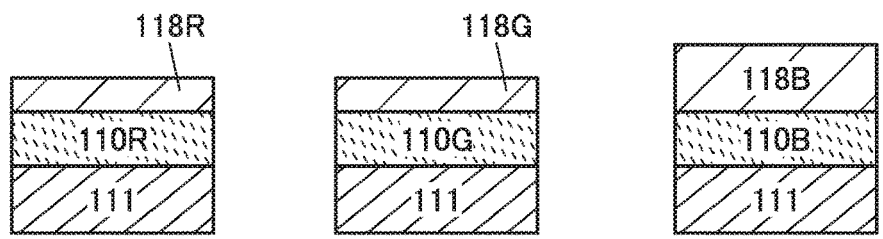

Next, the first electrodes 111, the optical adjustment layer 110R, the optical adjustment layer 110G, and the optical adjustment layer 110B are formed by etching (FIG. 3B). At this point, the thicknesses of the optical adjustment layers 110R, 110G, and 110B are substantially the same.

Figure 3C:
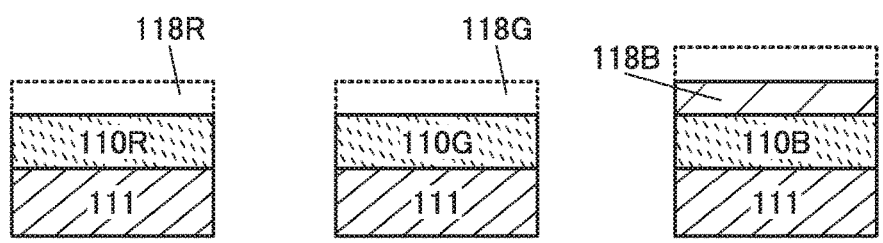

Then, the resist films 118R and 118G are removed by ashing or the like using oxygen plasma (FIG. 3C). Here, the resist film 118B having the second thickness is made thinner by approximately the first thickness (FIG. 3C).

Figure 3D:
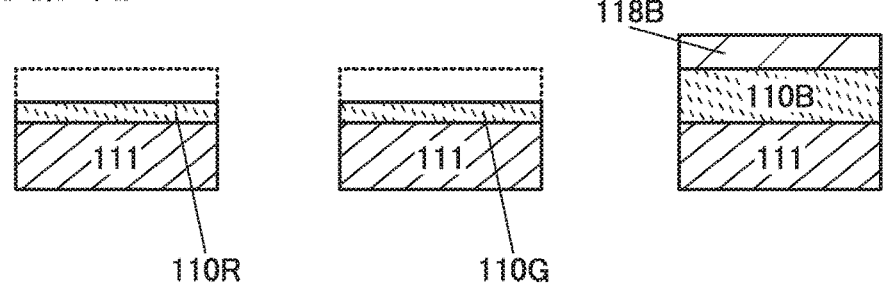
Figure 3E:
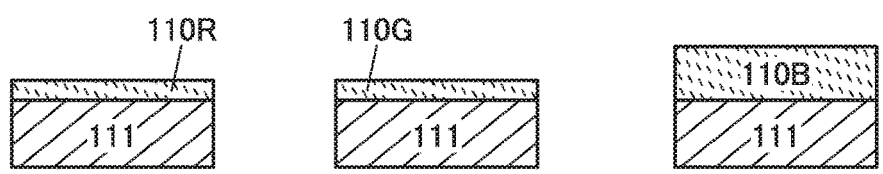

Subsequently, the optical adjustment layers 110R and 110G are made thinner by etching (FIG. 3D). At this time, the resist film 118B remains over the optical adjustment layer 110B, so that the optical adjustment layer 110B is not etched and remains thicker than the optical adjustment layers 110R and 110G.

Finally, the resist film 118B is removed. Through the above steps, the optical adjustment layer can be formed over the first electrode 111 of each of the light-emitting elements for different colors.

<Structure Example 2 of Light-Emitting Element>

Light-emitting elements of a display device in which subpixels of four colors of red (R), green (G), blue (B), and yellow (Y) express one color will be described with reference to FIGS. 4A to 4C.

Figure 4A:
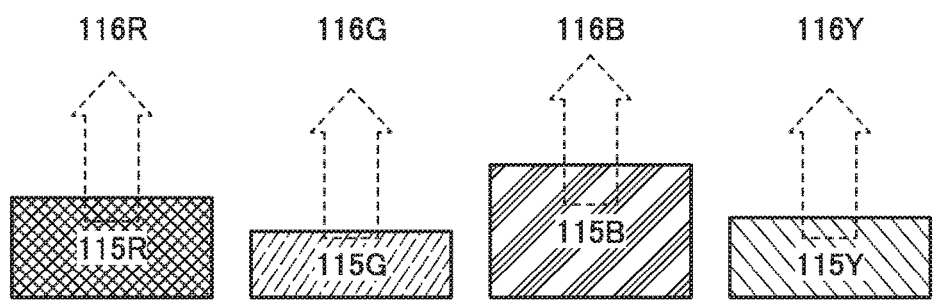
FIGS. 4A to 4C illustrate examples of light-emitting elements of a display device.

FIG. 4A illustrates the light-emitting element 115R that emits the red light 116R, the light-emitting element 115G that emits the green light 116G, the light-emitting element 115B that emits the blue light 116B, and a light-emitting element 115Y that emits yellow light 116Y.

The emission spectrum of the light-emitting element 115B has the first peak wavelength in the range of 400 nm to 480 nm, the emission spectrum of the light-emitting element 115R has the second peak wavelength in the range of 580 nm to 700 nm, the emission spectrum of the light-emitting element 115G has the third peak wavelength, which is longer than the first peak wavelength and shorter than the second peak wavelength, and the emission spectrum of the light-emitting element 115Y has a fourth peak wavelength, which is longer than the first peak wavelength and shorter than the second peak wavelength.

The light-emitting element 115B is thicker than the light-emitting element 115R, and the light-emitting element 115R is thicker than the light-emitting elements 115G and 115Y.

The difference between the thickness of the light-emitting element 115R and the thickness of the light-emitting element 115B is preferably greater than or equal to 40 nm and less than or equal to 90 nm, more preferably greater than or equal to 40 nm and less than or equal to 75 nm. As the difference between the thicknesses of the two elements becomes small, the two elements each emit light with favorable chromaticity.

Figure 4B:
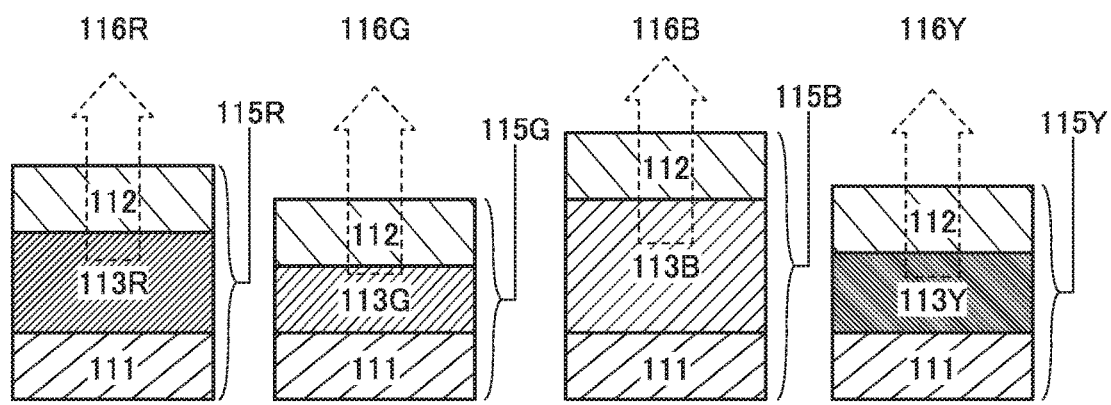

FIG. 4B illustrates structure examples of the light-emitting elements. The light-emitting elements each include an EL layer between the pair of electrodes. The light-emitting element 115R includes the EL layer 113R between the first electrode 111 and the second electrode 112. The light-emitting element 115G includes the EL layer 113G between the first electrode 111 and the second electrode 112. The light-emitting element 115B includes the EL layer 113B between the first electrode 111 and the second electrode 112. The light-emitting element 115Y includes an EL layer 113Y between the first electrode 111 and the second electrode 112.

The first electrode 111 serves as an anode. The second electrode 112 serves as a cathode.

The first electrode 111 is a reflective electrode, and the second electrode 112 is a transflective electrode. With a microcavity structure, light emitted from the EL layer can be resonated between the electrodes and light obtained through the second electrode 112 can be intensified.

Materials, thicknesses, and the like of the pair of electrodes of the four light-emitting elements illustrated in FIG. 4B can be the same. Accordingly, the manufacturing cost of the display device can be reduced and the manufacturing process of the display device can be simplified.

In FIG. 4B, the distance between the pair of electrodes of each light-emitting element corresponds to the thickness of the EL layer. The EL layer 113B is thicker than the EL layer 113R, and the EL layer 113R is thicker than the EL layers 113G and 113Y.

The structure of the EL layer is the same as that in Structure example 1 of the light-emitting element; thus, the detailed descriptions thereof are omitted.

As illustrated in FIG. 4B, since the EL layers are formed to have different structures according to their respective colors, the light-emitting elements can be easily formed to have an appropriate thickness according to their respective colors.

As in the light-emitting elements of the other colors, the thickness of the EL layer 113Y of the light-emitting element 115Y is adjusted so that the optical length between the first electrode 111 and the second electrode 112 is set to an optical length that increases the emission intensity of yellow light.

For example, the optical length between the electrodes of each of the light-emitting elements 115R, 115G, and 115Y is preferably adjusted to ½ wavelength, and the optical length between the electrodes of the light-emitting element 115B is preferably adjusted to 1 wavelength.

Figure 4C:
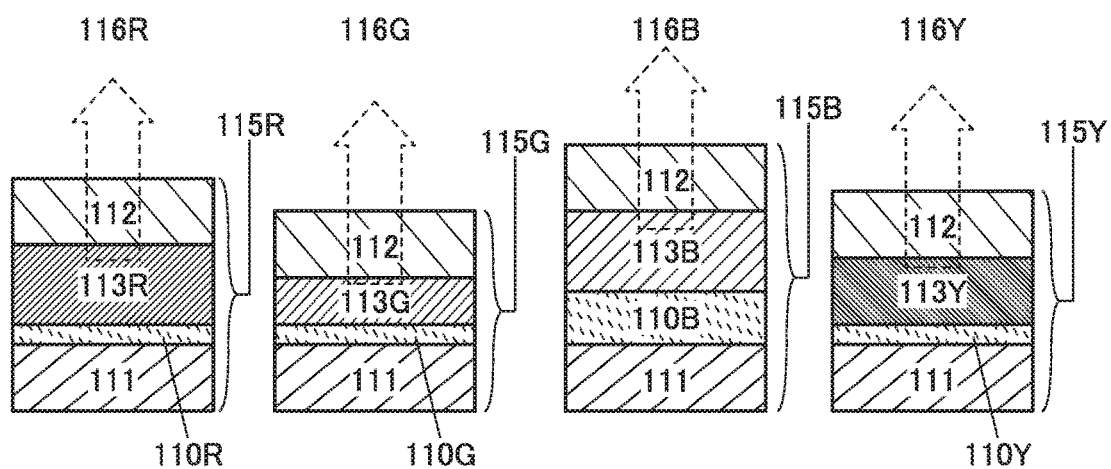

FIG. 4C illustrates structure examples of the light-emitting elements different from those in FIG. 4B. The light-emitting elements illustrated in FIG. 4C are different from those illustrated in FIG. 4B in each including an optical adjustment layer between the first electrode and the EL layer. The light-emitting element 115R includes the optical adjustment layer 110R between the first electrode 111 and the EL layer 113R. The light-emitting element 115G includes the optical adjustment layer 110G between the first electrode 111 and the EL layer 113G. The light-emitting element 115B includes the optical adjustment layer 110B between the first electrode 111 and the EL layer 113B. The light-emitting element 115Y includes an optical adjustment layer 110Y between the first electrode 111 and the EL layer 113Y.

In FIG. 4C, the distance between the pair of electrodes of each light-emitting element corresponds to the sum of the thicknesses of the EL layer and the optical adjustment layer. The sum of the thicknesses of the EL layer 113B and the optical adjustment layer 110B is greater than the sum of the thicknesses of the EL layer 113R and the optical adjustment layer 110R. The sum of the thicknesses of the EL layer 113R and the optical adjustment layer 110R is greater than the sum of the thicknesses of the EL layer 113G and the optical adjustment layer 110G and the sum of the thicknesses of the EL layer 113Y and the optical adjustment layer 110Y.

Optical adjustment can be performed by controlling the thicknesses of the EL layer and the optical adjustment layer.

As the optical adjustment layer, a conductive film which transmits visible light (transparent conductive film) can be used.

The description in Structure example 1 can be referred to for the structure example of the EL layer of each light-emitting element.

<Chromaticity Range of Display Device>

The display device of this embodiment includes a plurality of light-emitting elements and can display a full-color image. Some standards are established as quality indicators for full-color displays.

For example, the sRGB standard, which is an international standard for color spaces defined by the International Electrotechnical Commission (IEC) to standardize color reproduction on devices such as displays, printers, digital cameras, and scanners, is widely used. Note that in the sRGB standard, the chromaticities (x, y) on the CIE 1931 chromaticity coordinates (x,y chromaticity coordinates) defined by the International Commission on Illumination (CIE) are (0.640, 0.330) for red (R), (0.300, 0.600) for green (G), and (0.150, 0.060) for blue (B).

In the NTSC standard, which is a color gamut standard for analog television systems defined by the National Television System Committee (NTSC) in America, the chromaticities (x, y) are (0.670, 0.330) for red (R), (0.210, 0.710) for green (G), and (0.140, 0.080) for blue (B).

In the DCI-P3 standard (defined by Digital Cinema Initiatives, LLC), which is the international unified standard used when distributing digital movies (cinema), the chromaticities (x, y) are (0.680, 0.320) for red (R), (0.265, 0.690) for green (G), and (0.150, 0.060) for blue (B).

In Recommendation ITU-R BT.2020 (hereinafter referred to as BT.2020) for ultra high definition television (UHDTV, also referred to as Super Hi-Vision), which is the standard defined by Japan Broadcasting Corporation (NHK), the chromaticities (x, y) are (0.708, 0.292) for red, (0.170, 0.797) for green, and (0.131, 0.046) for blue.

As described above, a variety of standards for displays are defined. The display device of one embodiment of the present invention preferably includes light-emitting elements (a light-emitting element that emits red light, a light-emitting element that emits green light, and a light-emitting element that emits blue light) that emit light whose chromaticities fall within the chromaticity ranges (a region A, a region B, and a region C) represented by color coordinates in FIG. 5.

Figure 5:
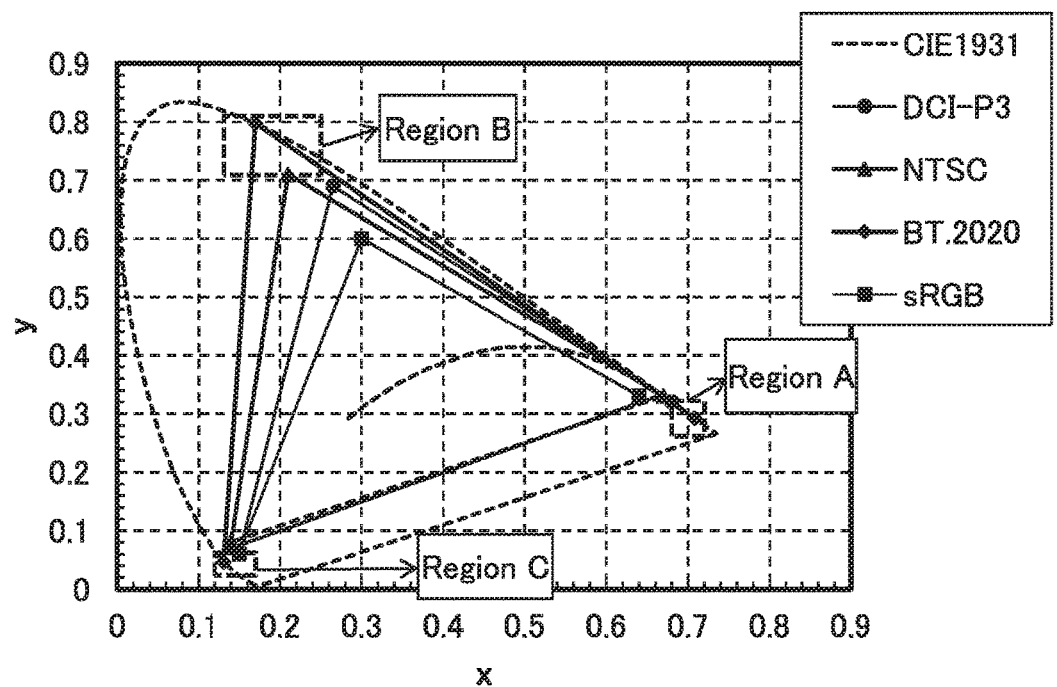
FIG. 5 is a chromaticity diagram showing chromaticity ranges of a display device.

In FIG. 1A, light having a chromaticity that falls within the region A in the color coordinates in FIG. 5 is preferably emitted from the light-emitting element 115R, for example. That is, the light 116R emitted from the light-emitting element 115R preferably has a chromaticity x of greater than 0.680 and less than or equal to 0.720 and a chromaticity y of greater than or equal to 0.260 and less than or equal to 0.320 on the CIE 1931 chromaticity coordinates.

In addition, in FIG. 1A, light having a chromaticity that falls within the region B in the color coordinates in FIG. 5 is preferably emitted from the light-emitting element 115G. That is, the light 116G emitted from the light-emitting element 115G preferably has a chromaticity x of greater than or equal to 0.130 and less than or equal to 0.250 and a chromaticity y of greater than 0.710 and less than or equal to 0.810 on the CIE 1931 chromaticity coordinates.

Furthermore, in FIG. 1A, light having a chromaticity that falls within the region C in the color coordinates in FIG. 5 is preferably emitted from the light-emitting element 115B. That is, light 116B emitted from the light-emitting element 115B preferably has a chromaticity x of greater than or equal to 0.120 and less than or equal to 0.170 and a chromaticity y of greater than or equal to 0.020 and less than 0.060 on the CIE 1931 chromaticity coordinates.

Note that a display device may include color filters and a structure in which the light-emitting elements and the color filters are used in combination and light emitted from the light-emitting elements through the color filters have chromaticities that fall within the above chromaticity ranges may be employed.

Note that the peak wavelength of the emission spectrum of the light-emitting element 115R is preferably greater than or equal to 620 nm and less than or equal to 680 nm. The peak wavelength of the emission spectrum of the light-emitting element 115G is preferably greater than or equal to 500 nm and less than or equal to 530 nm. The peak wavelength of the emission spectrum of the light-emitting element 115B is preferably greater than or equal to 430 nm and less than or equal to 460 nm. The half widths of the emission spectra of the light-emitting elements 115R, 115G, and 115B are preferably greater than or equal to 5 nm and less than or equal to 45 nm, greater than or equal to 5 nm and less than or equal to 35 nm, and greater than or equal to 5 nm and less than or equal to 25 nm, respectively. The peak wavelengths and the half widths of emission spectra of light passed through the color filters have similar values.

In the display device of one embodiment of the present invention, the above chromaticities are preferably obtained so that the area ratio with respect to the BT.2020 color gamut in the CIE chromaticity coordinates (x, y) can become higher than or equal to 80%, or the color gamut coverage can become higher than or equal to 75%. Further preferably, the area ratio is higher than or equal to 90% or the coverage is higher than or equal to 85%.

The chromaticities may be measured with any of a luminance colorimeter, a spectroradiometer, and an emission spectrometer, and it is sufficient that the above-described chromaticities be met in any one of the measurements. Note that it is preferable that the above-described chromaticities be met in all of the measurements.

As described above, the display device of one embodiment of the present invention can display an image with a wide color gamut and can have a wide viewing angle.

<Structure Example 1 of Display Device>

Figure 6A:
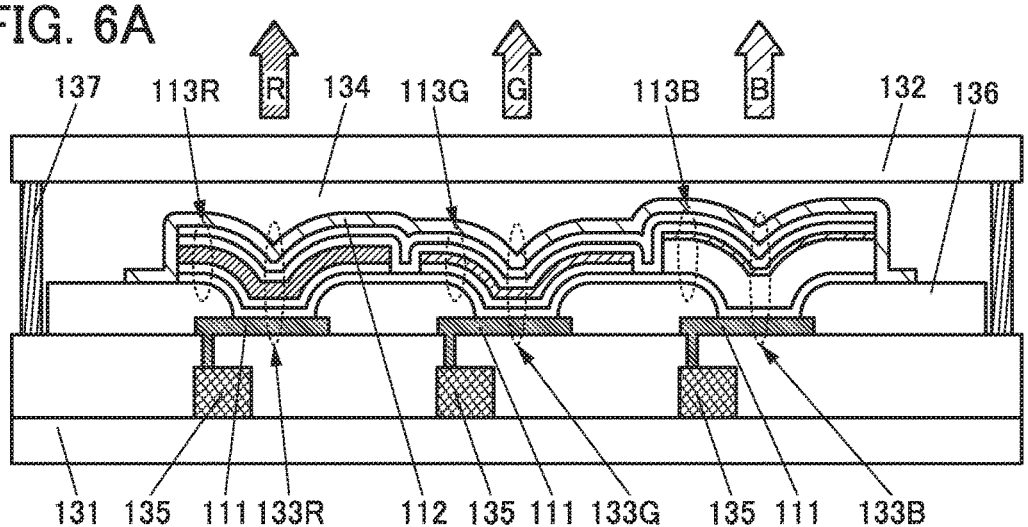
FIGS. 6A to 6C illustrate examples of a display device.
Figure 6B:
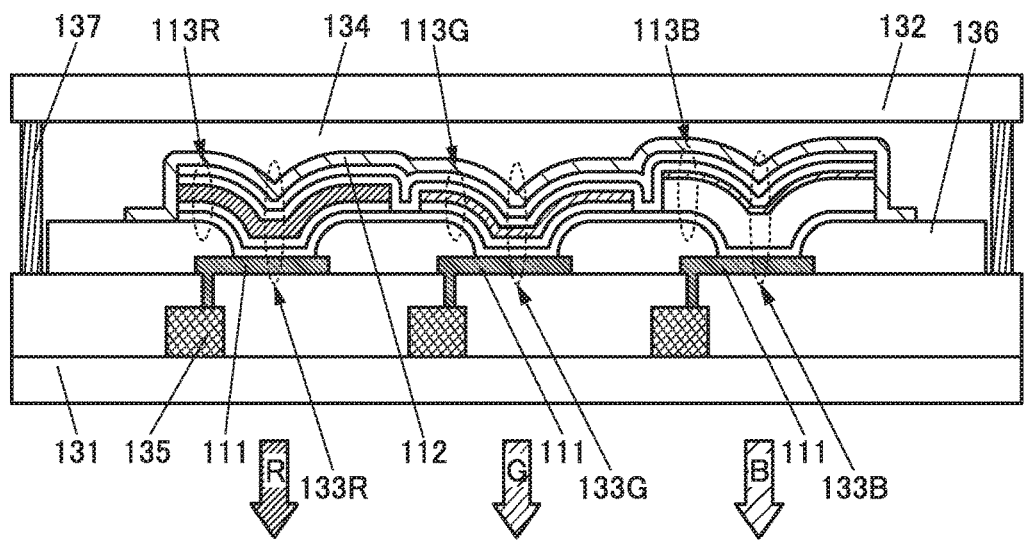
Figure 6C:
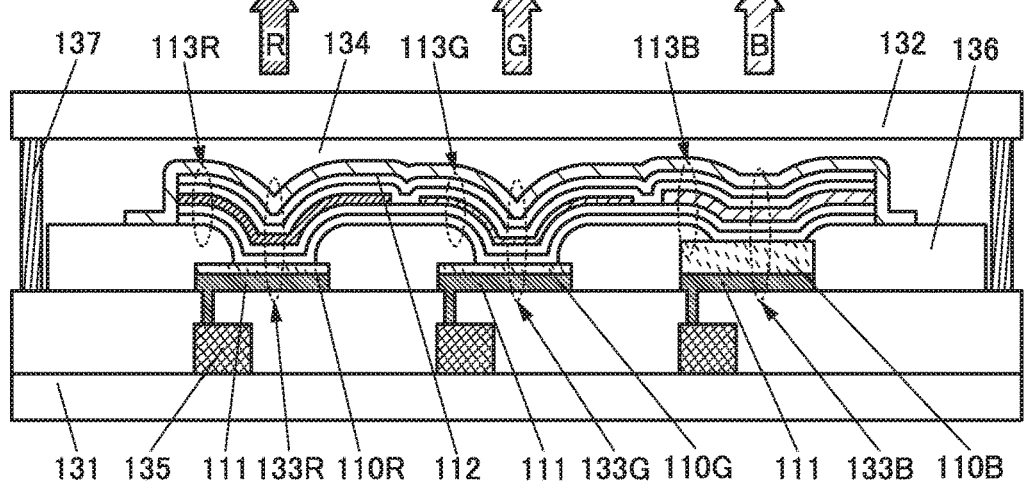

FIGS. 6A to 6C illustrate display devices each having a structure in which subpixels of three colors of red (R), green (G), and blue (B) express one color.

The display devices illustrated in FIGS. 6A to 6C each include a substrate 131, a substrate 132, transistors 135, a red-light-emitting element 133R, a green-light-emitting element 133G, a blue-light-emitting element 133B, and the like.

The display devices illustrated in FIGS. 6A to 6C are each an active-matrix display device in which a transistor is electrically connected to a light-emitting element.

The display devices illustrated in FIGS. 6A and 6C each have a top emission structure, and light from each light-emitting element is emitted through the substrate 132. Note that the display device can have a bottom emission structure as illustrated in FIG. 6B. A material that transmits visible light is used for the substrate through which light is extracted.

The light-emitting elements for different colors each include the first electrode 111, the second electrode 112, and the EL layer (the EL layer 113R, 113G, or 113B).

The first electrode 111 is electrically connected to the transistor 135. The first electrode 111 is separated between the light-emitting elements. An end portion of the first electrode 111 is covered with an insulating layer 136. The second electrode 112 is shared by the light-emitting elements for three colors.

The first electrode 111 illustrated in FIGS. 6A and 6C serves as a reflective electrode. The second electrode 112 illustrated in FIGS. 6A and 6C serves as a transflective electrode. The first electrode 111 illustrated in FIG. 6B serves as a transflective electrode. The second electrode 112 illustrated in FIG. 6B serves as a reflective electrode.

The blue-light-emitting element 133B is thicker than the red-light-emitting element 133R, and the red-light-emitting element 133R is thicker than the green-light-emitting element 133G. Specifically, the distance between the electrodes of the blue-light-emitting element 133B is longer than that of the red-light-emitting element 133R, and the distance between the electrodes of the blue-light-emitting element 133R is longer than that of the red-light-emitting element 133G. With such a structure, a color shift is hardly caused between when the display device is seen from the front and when the display device is seen from the oblique direction. Therefore, a display device with a wide viewing angle can be obtained.

At least one layer included in the EL layer of each light-emitting element is formed separately for each color.

The structures of the EL layers 113R, 113G, and 113B illustrated in FIGS. 6A and 6B are similar to those illustrated in FIG. 2A. Specifically, a hole-injection layer, an electron-transport layer, and an electron-injection layer are shared by the light-emitting elements for three colors, and a hole-transport layer and a light-emitting layer are provided for each of the light-emitting elements for different colors. Although the hole-transport layer and the light-emitting layer are separately provided for each color in the examples of FIGS. 6A and 6B, hole-transport layers and light-emitting layers of adjacent light-emitting elements in a display device with high resolution may partly overlap with each other, as described above.

The structures of the EL layers 113R, 113G, and 113B illustrated in FIG. 6C are similar to those illustrated in FIG. 2B. Specifically, a hole-injection layer, a hole-transport layer, an electron-transport layer, and an electron-injection layer are shared by the light-emitting elements for three colors, and a light-emitting layer are provided for each of the light-emitting elements for three colors.

The display devices illustrated in FIGS. 6A to 6C each have a microcavity structure in which the optical length between the electrodes of each light-emitting element is adjusted according to their respective emission colors. Note that each light-emitting element may include the optical adjustment layer (the optical adjustment layer 110R, 110G, or 110B) as illustrated in FIG. 6C.

The light-emitting element is sealed with the substrate 131, the substrate 132, and a bonding layer 137. When a space 134 surrounded with the substrate 131, the substrate 132, and the bonding layer 137 has the following structure, entry of impurities such as moisture and oxygen into the light-emitting element can be suppressed and the lifetime of the light-emitting element can be extended. The space 134 is preferably in a reduced pressure. Alternatively, the space 134 is preferably filled with an inert gas such as a rare gas or a nitrogen gas, or an organic resin. In FIG. 6B, light does not need to be extracted through the space 134; thus, a space for a desiccant or the like can be easily secured in the space 134.

With such a structure, a display device with a wide viewing angle can be obtained.

<Structure Example 2 of Display Device>

Figure 7A:
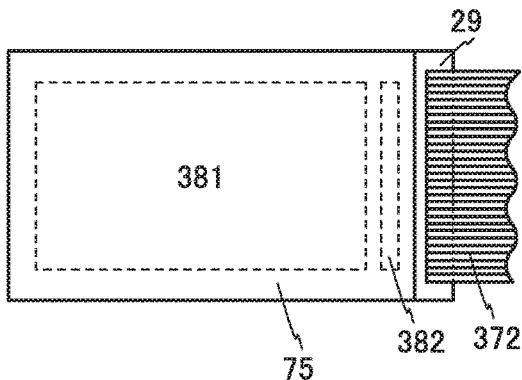
FIGS. 7A to 7C illustrate examples of a display device.
Figure 7B:
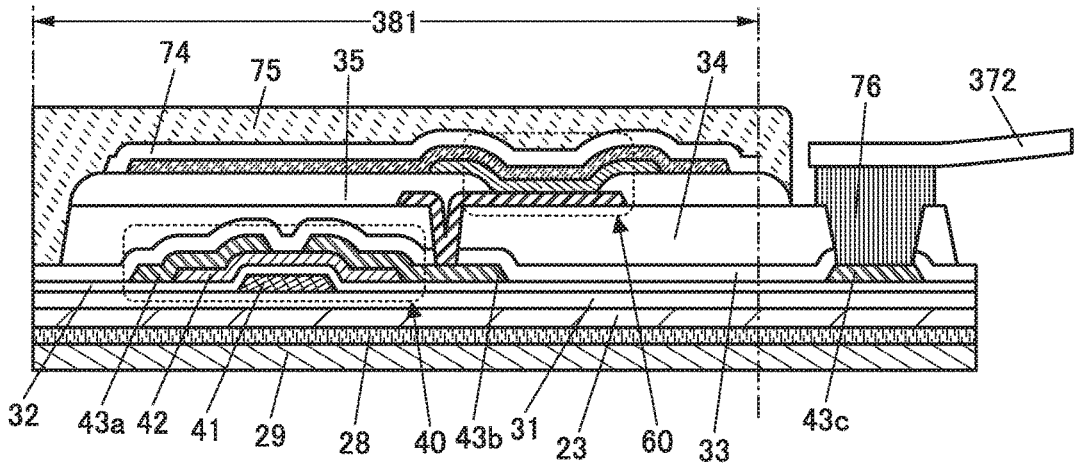
Figure 7C:
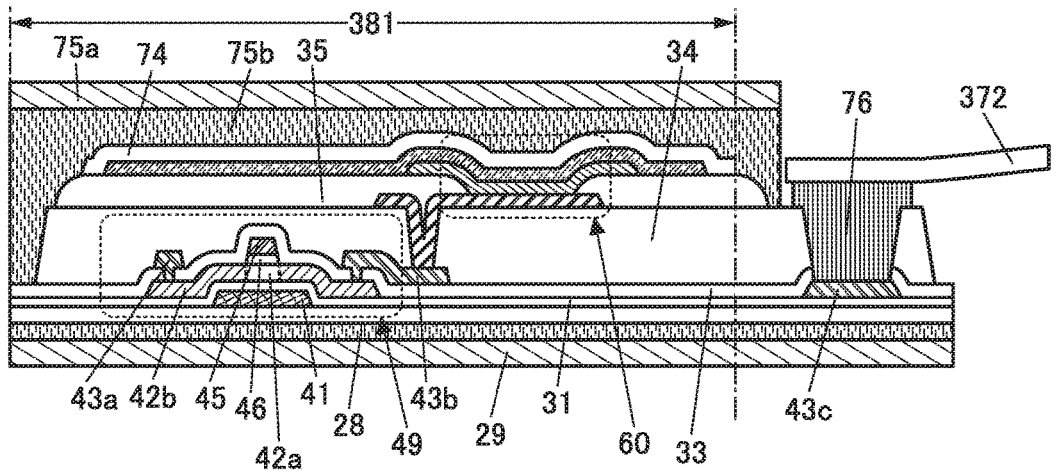

In this structure example, a display device with flexibility will be described. FIG. 7A is a top view of a display device 10A. FIG. 7B is a cross-sectional view of a display portion 381 and a portion for connection to an FPC 372 in the display device 10A. FIG. 7C is a cross-sectional view of a display device 10B, which is a modification example of the display device 10A.

The display devices 10A and 10B can be held in a bent state and can be bent repeatedly, for example. Components of the display devices 10A and 10B are each formed using a flexible material.

Since the flexible display devices 10A and 10B can be used while the display portion 381 is bent, the flexible display devices 10A and 10B can be applied to a variety of uses. According to one embodiment of the present invention, the display devices 10A and 10B can each have a wide viewing angle. Therefore, a change in chromaticity depending on the angle is small even when the display portion 381 is bent, so that favorable display quality can be obtained.

The display devices 10A and 10B each include the display portion 381 and the driver circuit portion 382. The FPC 372 is attached to each of the display devices 10A and 10B.

A conductive layer 43c is electrically connected to the FPC 372 through a connector 76 (FIGS. 7B and 7C). The conductive layer 43c can be formed using the same material and the same step as those used to form a source and a drain of a transistor.

As the connector 76, any of various anisotropic conductive films (ACF), anisotropic conductive pastes (ACP), and the like can be used.

The display device 10A illustrated in FIGS. 7A and 7B includes a protective layer 75 and a substrate 29. The protective layer 75 side is the display surface side of the display device 10A. The protective layer 75 preferably has a high visible-light transmitting property. The protective layer 75 preferably includes an organic insulating film because it is possible to prevent the surface of the display device 10A from being damaged or cracked.

The display device 10A illustrated in FIG. 7B includes a transistor 40 over an insulating layer 31. The substrate 29 is attached to the insulating layer 31 with a bonding layer 28. An insulating layer 33 and an insulating layer 34 are provided over the transistor 40. The transistor 40 and a light-emitting element 60 are electrically connected to each other through an opening provided in the insulating layers 33 and 34. An end portion of a lower electrode of the light-emitting element 60 is covered with an insulating layer 35. An insulating layer 74 is provided over an upper electrode of the light-emitting element 60. In other words, the light-emitting element 60 is sealed with the insulating layer 74.

The transistor 40 is a bottom-gate transistor including a semiconductor layer 42.

As the semiconductor layer 42, a metal oxide layer functioning as an oxide semiconductor layer is preferably used. A semiconductor material such as an oxide semiconductor having a wider band gap and a lower carrier density than silicon is preferably used because off-state current of the transistor can be reduced.

Note that the display device of one embodiment of the present invention is not limited to the structure in which the transistor includes a metal oxide in the semiconductor layer. The display device of one embodiment of the present invention can include silicon in the semiconductor layer of the transistor, for example. As silicon, for example, amorphous silicon or crystalline silicon can be used. Examples of crystalline silicon include microcrystalline silicon, polycrystalline silicon, and single crystal silicon. As silicon, low-temperature polysilicon (LTPS) is preferably used. Polycrystalline silicon, e.g., LTPS, can be formed at a lower temperature than single crystal silicon and has higher field effect mobility and higher reliability than amorphous silicon.

In the transistor 40, part of a conductive layer 41 functions as a gate, part of an insulating layer 32 functions as a gate insulating layer, and a conductive layer 43a and a conductive layer 43b function as a source and a drain.

The display device 10B illustrated in FIG. 7C is different from the display device 10A illustrated in FIGS. 7A and 7B in including a transistor 49 in place of the transistor 40, and a substrate 75a and a bonding layer 75b in place of the protective layer 75. Components of the display device 10B that are similar to those of the display device 10A are not described in detail.

The transistor 49 illustrated in FIG. 7C includes a semiconductor layer and two gates.

In the transistor 49, part of the conductive layer 41 functions as a gate, part of the insulating layer 31 functions as a gate insulating layer, part of an insulating layer 46 functions as a gate insulating layer, and part of a conductive layer 45 functions as a gate. The semiconductor layer includes a channel region 42a and a low-resistance region 42b. The channel region 42a overlaps with the conducting layer 45 with the insulating layer 46 interposed therebetween. The low-resistance region 42b includes a portion connected to the conductive layer 43a and a portion connected to the conductive layer 43b.

The structure in which the semiconductor layer where a channel is formed is provided between two gates is used for the transistor 49. Such a structure enables the control of the threshold voltage of the transistor. The two gates may be connected to each other and supplied with the same signal to operate the transistor. Such a transistor can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistor can be controlled.

<Structure Example 3 of Display Device>

Figure 8A:
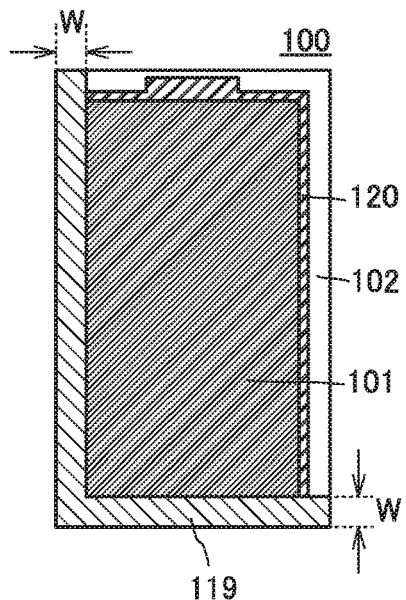
FIGS. 8A to 8C illustrate examples of a display device.
Figure 8B:
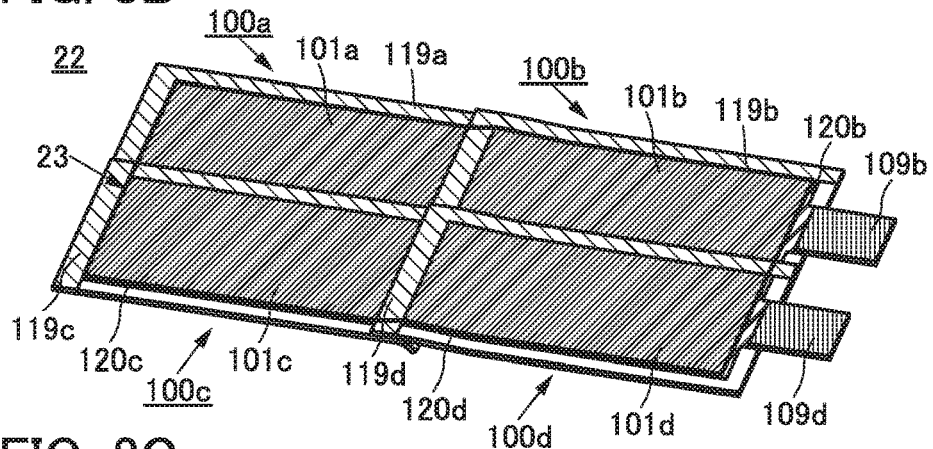
Figure 8C:
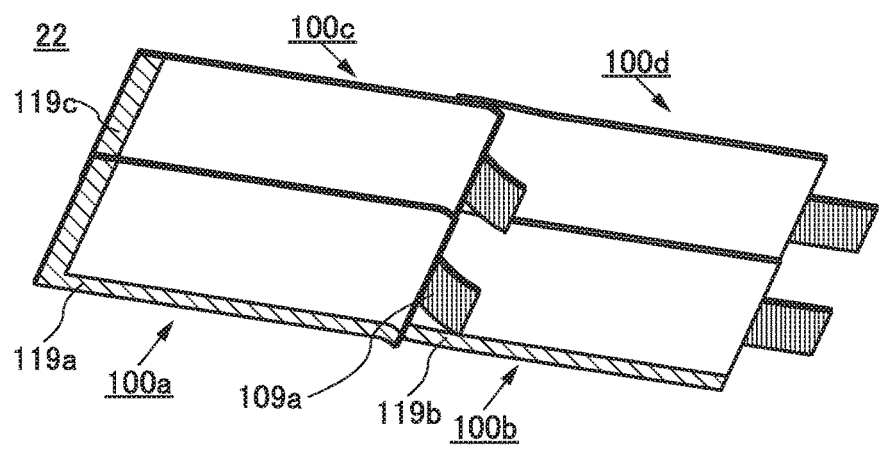

In this structure example, a display device with flexibility will be described. FIG. 8A is a top view of a display device 100. FIGS. 8B and 8C are each a perspective view of a multidisplay using four display devices 100.

The display device 100 can be held in a bent state and can be bent repeatedly, for example. Components of the display device 100 are each formed using a flexible material. According to one embodiment of the present invention, the display device 100 can have a wide viewing angle. Therefore, a change in chromaticity depending on the angle is small even when the display device 100 is bent, so that favorable display quality can be obtained.

A multidisplay can be formed by combination with the plurality of display devices 100. The size of the multidisplay is easily increased. According to one embodiment of the present invention, the display device 100 can have a wide viewing angle. Thus, a change in chromaticity depending on the angle is small even when a plurality of viewers see the multidisplay from various angles at the same time, so that favorable display quality can be obtained. Moreover, a display portion of the multidisplay can have a curved surface, and favorable display quality can be obtained also in this case.

The display device 100 includes a display region 101 and a region 102. The region 102 includes a region 119 transmitting visible light and a region 120 blocking visible light. The region 119 transmitting visible light and the region 120 blocking visible light are each adjacent to the display region 101. In the display device 100 illustrated in FIG. 8A, the region 119 transmitting visible light is provided along two sides of the display region 101. The width W of the region 119 transmitting visible light along one side of the display region 101 may be the same as or different from the width W of the region 119 transmitting visible light along the other side. FIG. 8A illustrates an example in which the widths are the same.

A multidisplay 22 illustrated in FIGS. 8B and 8C includes four display devices 100 illustrated in FIG. 8A arranged in a 2×2 matrix (two display devices in the longitudinal direction and the lateral direction). FIG. 8B is a perspective view of the multidisplay 22 on the display surface side. FIG. 8C is a perspective view of the multidisplay 22 on the side opposite to the display surface side.

FIGS. 8B and 8C illustrate examples where each of the display devices is electrically connected to an FPC.

The multidisplay 22 illustrated in FIGS. 8B and 8C includes display devices 100a, 100b, 100c, and 100d.

In FIGS. 8B and 8C, short sides of the display devices 100a and 100b overlap with each other such that part of a display region 101a and part of a region 119b transmitting visible light overlap with each other. Furthermore, long sides of the display devices 100a and 100c overlap with each other such that part of the display region 101a and part of a region 119c transmitting visible light overlap with each other.

In FIGS. 8B and 8C, part of a display region 101b overlaps with part of the region 119c transmitting visible light and part of a region 119d transmitting visible light. In addition, part of a display region 101c overlaps with part of the region 119d transmitting visible light.

Thus, as illustrated in FIG. 8B, a region where the display region 101a, the display region 101b, the display region 101c, and a display region 101d are placed seamlessly can serve as a display region 23 of the multidisplay 22.

In the center portion of the multidisplay 22, the display device 100b is stacked over the display device 100a, the display device 100c is stacked over the display device 100b, and the display device 100d is stacked over the display device 100c.

The display device 100 has flexibility. Thus, as illustrated in FIGS. 8B and 8C, a region near an FPC 109a of the display device 100a can be bent so that part of the display device 100a and part of the FPC 109a can be placed under the display region 101b of the display device 100b adjacent to the FPC 109a. As a result, the FPC 109a can be placed without physical interference with the rear surface of the display device 100b. Furthermore, when the display device 100a and the display device 100b overlap with each other and are fixed, it is not necessary to consider the thickness of the FPC 109a; thus, the top surface of the region 119b transmitting visible light and the top surface of the display device 100a can be substantially leveled. This can make an end portion of the display device 100b over the display region 101a less noticeable.

Moreover, each display device 100 is made flexible, in which case the display device 100b can be curved gently so that the top surface of the display region 101b of the display device 100b and the top surface of the display region 101a of the display device 100a are leveled. Thus, the display regions can be leveled except a region where the display device 100a and the display device 100b overlap with each other and the vicinity thereof, so that the display quality of an image displayed on the display region 23 of the multidisplay 22 can be improved.

The display device of this embodiment employs a separate coloring method and a microcavity structure for a light-emitting element. In the case where full-color display is performed by light-emitting elements for two or more colors including red and blue, for example, color shifts of red, blue and white occurring when the display device is seen from the oblique direction can be suppressed by making the thickness of the blue-light-emitting element largest (or the distance between electrodes longest) and the thickness of the red-light-emitting element second largest (or the distance between electrodes longest). As a result, the viewing angle of the display device can be widened and an image with a wide color gamut can be displayed.

This embodiment can be combined with any of other embodiments as appropriate. In the case where a plurality of structure examples are described in one embodiment in this specification, some of the structure examples can be combined as appropriate.

Embodiment 2

In this embodiment, a light-emitting element that can be used for the display device of one embodiment of the present invention is described with reference to FIG. 2B.

In this embodiment, materials that can be used for the light-emitting element described as an example in Embodiment 1 are mainly described.

<First Electrode and Second Electrode>

The first electrode 111 illustrated in FIG. 2B is a reflective electrode having a reflecting property with respect to visible light. The reflective electrode has a visible light reflectance of higher than or equal to 40% and lower than or equal to 100%, and preferably higher than or equal to 70% and lower than or equal to 100%. The first electrode 111 preferably has a resistivity of $1\times10^{-2}$ Ωcm or less.

The second electrode 112 illustrated in FIG. 2B is a transflective electrode. The transflective electrode has a visible light reflectance of higher than or equal to 20 % and lower than or equal to 80 %, and preferably higher than or equal to 40% and lower than or equal to 70%. The second electrode 112 preferably has a resistivity of $1\times10^{-2}$ Ωcm or less.

The optical adjustment layers 110R, 110G, and 110B illustrated in FIG. 2B are each a transparent electrode having a transmitting property with respect to visible light. The transparent electrode has a visible light reflectance of higher than or equal to 40%. The optical adjustment layers 110R, 110G, and 110B each preferably has a resistivity of $1\times10^{-2}$ Ωcm or less.

As materials used for the first electrode 111, the second electrode 112, and the optical adjustment layers 110R, 110G, and 110B, any of the materials below can be used in an appropriate combination as long as the functions of the electrodes described above can be fulfilled. For example, a metal, an alloy, an electrically conductive compound, a mixture of these, and the like can be appropriately used. Specifically, an In-Sn oxide (also referred to as ITO), an In-Si-Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

<Hole-Injection Layer and Hole-Transport Layer>

The hole-injection layer 121 injects holes from the first electrode 111 that is an anode to the EL layer and contains a material with a high hole-injection property.

As examples of the material with a high hole-injection property, transition metal oxides such as molybdenum oxide, vanadium oxide, ruthenium oxide, tungsten oxide, and manganese oxide can be given. Alternatively, it is possible to use any of the following materials: phthalocyanine-based compounds such as phthalocyanine (abbreviation: $H_2Pc$) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material with a high hole-injection property, a composite material containing a hole-transport material and an acceptor material (an electron-accepting material) can also be used. In that case, the acceptor material extracts electrons from a hole-transport material, so that holes are generated in the hole-injection layer 121 and the holes are injected into the light-emitting layer through the hole-transport layer 122. Note that each of the hole-injection layer 121 may be formed to have a single-layer structure using a composite material containing a hole-transport material and an acceptor material (electron-accepting material), or a stacked-layer structure in which a layer including a hole-transport material and a layer including an acceptor material (electron-accepting material) are stacked.

The hole-transport layer 122 transports the holes, which are injected from the first electrode 111 by the hole-injection layer 121, to the light-emitting layer. Note that the hole-transport layer 122 contains a hole-transport material. It is particularly preferable that the HOMO level of the hole-transport material included in the hole-transport layer 122 be the same as or close to that of the hole-injection layer 121.

Examples of the acceptor material used for the hole-injection layer 121 include an oxide of a metal belonging to any of Group 4 to Group 8 of the periodic table. As specific examples, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), or the like can be used.

The hole-transport materials used for the hole-injection layer 121 and the hole-transport layer 122 are preferably substances with a hole mobility of greater than or equal to $10^{-6}$ cm$^2$/Vs. Note that other substances may be used as long as the substances have a hole-transport property higher than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4"-tris(carbazol-9-yl)triphenylamine (abbreviation: TCTA), 4,4',4"-tris(N,N-diphenylamino)triphenylamine (abbreviation: TDATA), and 4,4',4"-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

A high molecular compound such as poly(N-vinylcarbazole) (abbreviation: PVK), poly(4-vinyltriphenylamine) (abbreviation: PVTPA), poly [N-(4-{N-[4-(4-diphenylamino)phenyl]phenyl-N-phenylamino}phenyl)methacrylamide] (abbreviation: PTPDMA), or poly [N,N'-bis(4-butylphenyl)-N,N-bis(phenyl)benzidine] (abbreviation: Poly-TPD) can also be used.

Note that the hole-transport material is not limited to the above examples and may be one of or a combination of various known materials when used for the hole-injection layer 121 and the hole-transport layer 122. Note that the hole-transport layer may be formed of a plurality of layers. That is, for example, the hole-transport layer may have a stacked-layer structure of a first hole-transport layer and a second hole-transport layer.

<Light-Emitting Layer>

The light-emitting layer contains a light-emitting substance. Note that as the light-emitting substance, a substance whose emission color is blue, violet, bluish violet, green, yellowish green, yellow, orange, red, or the like is appropriately used. When a plurality of light-emitting layers are formed using different light-emitting substances, different emission colors can be exhibited (for example, complementary emission colors are combined to achieve white light emission). Furthermore, a stacked-layer structure in which one light-emitting layer contains two or more kinds of light-emitting substances may be employed.

The light-emitting layer may contain one or more kinds of compounds (a host material and an assist material) in addition to a light-emitting substance (guest material). As the one or more kinds of compounds, one or both of the hole-transport material and the electron-transport material described in this embodiment can be used.

The light-emitting layer 123R contains a substance that emits red light (a red-light-emitting substance). The light-emitting layer 123G contains a substance that emits green light (a green-light-emitting substance). The light-emitting layer 123B contains a substance that emits blue light (a blue-light-emitting substance).

It is preferable that a light-emitting substance that converts singlet excitation energy into light emission in the visible light range be used as the blue-light-emitting substance and light-emitting substances that convert triplet excitation energy into light emission in the visible light range be used as the green- and red-light-emitting substances, whereby the spectrum balance between R, G, and B is improved.

Alternatively, a light-emitting substance that emits yellow light (a yellow-light-emitting material) can be used for the light-emitting layer of the light-emitting element 115Y illustrated in FIG. 4A that emits the yellow light 116Y. A light-emitting material that converts triplet excitation energy into emission of light in the visible light range is preferably used as the yellow-light-emitting material.

There is no particular limitation on the light-emitting substances that can be used for the light-emitting layer, and a light-emitting substance that converts singlet excitation energy into light emission in the visible light range or a light-emitting substance that converts triplet excitation energy into light emission in the visible light range can be used. Examples of the light-emitting substance are given below.

As an example of the light-emitting substance that converts singlet excitation energy into light emission, a substance that emits fluorescence (fluorescent material) can be given. Examples of the substance that emits fluorescence include pyrene derivatives, anthracene derivatives, triphenylene derivatives, fluorene derivatives, carbazole derivatives, dibenzothiophene derivatives, dibenzofuran derivatives, dibenzoquinoxaline derivatives, quinoxaline derivatives, pyridine derivatives, pyrimidine derivatives, phenanthrene derivatives, and naphthalene derivatives. Pyrene derivatives are particularly preferable because they have a high emission quantum yield. Specific examples of pyrene derivatives include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine] (abbreviation: 1,6BnfAPrn-02), and N,N-(pyrene-1,6-diyl)bis[(6,N-diphenylbenzo[b]naphtho[1,2-d]furan)-8-amine] (abbreviation: 1,6BnfAPrn-03). Pyrene derivatives are compounds effective for obtaining a favorable chromaticity value of blue of the display device of one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]N,N',N'-triphenyl-1,4-phenylenediamine (abbreviation: 2DPAPPA), or the like.

As examples of a light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit the respective emission colors (emission peaks) and thus, any of them is appropriately selected according to need.

As examples of a phosphorescent material that emits blue or green light and whose emission spectrum has a peak wavelength at greater than or equal to 450 nm and less than or equal to 570 nm, the following substances can be given.

For example, organometallic complexes having a 4H-triazole skeleton, such as tris{2-[5-(2-methylphenyl-4-(2,6-dimethylphenyl)-4H-1,2,4-triazol-3-yl-κN$^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,C$^2$']iridium(III) tetrakis(1-pyrazolyl)borate (abbreviation: FIr6), bis[2-(4',6'-difluorophenyl)pyridinato-N,C$^2$']iridium(III) picolinate (abbreviation: FIrpic), bis[2-(3,5-bistrifluoromethylphenyl)-pyridinato-N,C$^2$']iridium(III) picolinate (abbreviation: [Ir(CF$_3$ppy)$_2$(pic)]), and bis[2-(4',6'-difluorophenyOpyridinato-N,C$^{2'}$]iridium(III) acetylacetonate (abbreviation: FIr(acac)); and the like can be given.

As examples of a phosphorescent material that emits green or yellow light and whose emission spectrum has a peak wavelength at greater than or equal to 495 nm and less than or equal to 590 nm, the following substances can be given.

For example, organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN$^3$]phenyl-κC}iridium (III) (abbreviation: [Ir(dmppm-dmp)$_2$(acac)]), and (acetylacetonato)bis(4,6-diphenylpyrimidinato)iridium (III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium (III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]) can be given.

Among the above, organometallic iridium complexes having a pyridine skeleton (particularly, a phenylpyridine skeleton) or a pyrimidine skeleton are compounds effective for obtaining a favorable value of the chromaticity of green of the display device of one embodiment of the present invention.

As examples of a phosphorescent material that emits yellow or red light and whose emission spectrum has a peak wavelength at greater than or equal to 570 nm and less than or equal to 750 nm, the following substances can be given.

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(d1npm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazin yl-κN]phenyl-κC}(2,2,6,6-tetramethyl-3,5-heptanedionato-κ$^2$O, O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]) can be given.

Among the above, organometallic iridium complexes having a pyrazine skeleton are compounds effective for obtaining a favorable value the chromaticity of red of the display device of one embodiment of the present invention. In particular, organometallic iridium complexes having a cyano group (e.g., [Ir(dmdppr-dmCP)$_2$(dpm)]) are preferable because they are stable.

Note that as the blue-light-emitting substance, a substance whose photoluminescence peak wavelength is greater than or equal to 430 nm and less than or equal to 470 nm, preferably greater than or equal to 430 nm and less than or equal to 460 nm is preferably used. As the green-light-emitting substance, a substance whose photoluminescence peak wavelength is greater than or equal to 500 nm and less than or equal to 540 nm, preferably greater than or equal to 500 nm and less than or equal to 530 nm is preferably used. As the red-light-emitting substance, a substance whose photoluminescence peak wavelength is greater than or equal to 610 nm and less than or equal to 680 nm, preferably greater than or equal to 620 nm and less than or equal to 680 nm is preferably used. Note that the photoluminescence may be measured with either a solution or a thin film.

With the parallel use of such compounds and microcavity effect, the above chromaticity can be more easily met. Here, a transflective electrode (a metal thin film portion) that is needed for obtaining microcavity effect preferably has a thickness of greater than or equal to 20 nm and less than or equal to 40 nm, and further preferably greater than 25 nm and less than or equal to 40 nm. However, the thickness greater than 40 nm possibly reduces the efficiency.

As the compounds (the host material and the assist material) used in the light-emitting layer, one or more kinds of substances having a larger energy gap than the light-emitting substance (the guest material) are used. Note that the hole-transport materials listed above and the electron-transport materials given below can be used as the host material and the assist material, respectively.

When the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) which is higher than that of the light-emitting substance can be selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: Zn(BOX)$_2$), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBPhen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

In the case where a plurality of compounds are used for the light-emitting layer, it is preferable to use compounds that form an exciplex in combination with a light-emitting substance. In that case, although any of various compounds can be combined appropriately to be used, to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $10^6$ seconds or longer, preferably $10^{-3}$ seconds or longer.

Examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA) can be used. Note that a substance in which the π-electron rich heteroaromatic ring is directly bonded to the π-electron deficient heteroaromatic ring is particularly preferable because both the donor property of the π-electron rich heteroaromatic ring and the acceptor property of the π-electron deficient heteroaromatic ring are increased and the energy difference between the singlet excited state and the triplet excited state becomes small.

Note that when a TADF material is used, the TADF material can be combined with another organic compound.

<Electron-Transport Layer>

The electron-transport layer 124 transports the electrons, which are injected from the second electrode 112 by the electron-injection layer 125, to the light-emitting layer. Note that the electron-transport layer 124 contains an electron-transport material. It is preferable that the electron-transport material included in the electron-transport layer 124 be a substance with an electron mobility of higher than or equal to $1 \times 10^{-6}$ cm$^2$/Vs. Note that other substances may also be used as long as the substances have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxypheny enzothiazolato]zinc (abbreviation: Zn(BTZ)$_2$), heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazol-2-yl)stilbene (abbreviation: BzOs), and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h] quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Alternatively, a high molecular compound such as poly (2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The electron-transport layer 124 is not limited to a single layer, but may be a stack of two or more layers each containing any of the above substances.

<Electron-Injection Layer>

The electron-injection layer 125 contains a substance having a high electron-injection property. The electron-injection layer 125 can be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound like erbium fluoride (ErF$_3$) can also be used. Electride may also be used for the electron-injection layer 125. Examples of the electride include a substance in which electrons are added at high concentration to calcium oxide-aluminum oxide. Any of the substances for forming the electron-transport layer 124, which are given above, can also be used.

A composite material in which an organic compound and an electron donor (donor) are mixed may also be used for the electron-injection layer 125. Such a composite material is excellent in an electron-injection property and an electron-transport property because electrons are generated in the organic compound by the electron donor. The organic compound here is preferably a material excellent in transporting the generated electrons; specifically, for example, the electron-transport materials for forming the electron-transport layer 124 (e.g., a metal complex or a heteroaromatic compound) can be used. As the electron donor, a substance showing an electron-donating property with respect to the organic compound may be used. Preferable examples are an alkali metal, an alkaline earth metal, and a rare earth metal. Specifically, lithium, cesium, magnesium, calcium, erbium, ytterbium, and the like can be given. Furthermore, an alkali metal oxide and an alkaline earth metal oxide are preferable, and lithium oxide, calcium oxide, barium oxide, and the like can be given. Alternatively, a Lewis base such as magnesium oxide can be used. Further alternatively, an organic compound such as tetrathiafulvalene (abbreviation: TTF) can be used.

For fabrication of the light-emitting element in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers, the hole-transport layers, the light-emitting layers, the electron-transport layers, the electron-injection layers) included in the EL layers of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Note that materials that can be used for the functional layers (the hole-injection layers, the hole-transport layers, the light-emitting layers, the electron-transport layers, and the electron-injection layers) that are included in the EL layers in the light-emitting element described in this embodiment are not limited to the above materials, and other materials can be used in combination as long as the functions of the layers are fulfilled. For example, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot may be a colloidal quantum dot, an alloyed quantum dot, a core-shell quantum dot, a core quantum dot, or the like.

This embodiment can be combined with any of other embodiments as appropriate.

Embodiment 3

In this embodiment, an electronic device of one embodiment of the present invention will be described with reference to drawings.

Examples of electronic devices include a television set, a monitor of a computer or the like, a digital camera, a digital video camera, a digital photo frame, a mobile phone (also referred to as a cellular phone or a mobile phone), a portable game console, a portable information terminal, an audio reproducing device, and a large game machine, such as a pachinko machine.

The electronic device of this embodiment including the display device of one embodiment of the present invention in a display portion has favorable viewing angle characteristics and high display quality.

The display device of one embodiment of the present invention can be suitably used for an electronic device whose display portion is seen from various angles. The display device of one embodiment of the present invention can be suitably used for an electronic device with a large screen, in particular, an electronic device that achieves both high resolution and a large screen. The display device of one embodiment of the present invention can be suitably used for a highly flexible display portion of an electronic device.

The display portion of the electronic device of this embodiment can display, for example, an image with a resolution of full high definition, 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

The electronic device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of this embodiment may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of this embodiment can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 9A:
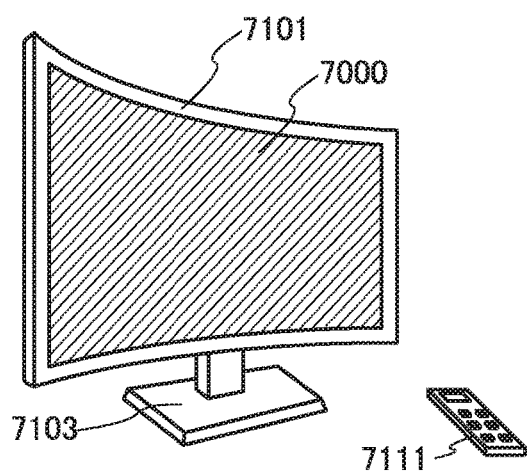
FIGS. 9A to 9D illustrate examples of an electronic device.

FIG. 9A illustrates an example of a television device. In a television device 7100, a display portion 7000 is incorporated in a housing 7101. In addition, here, the housing 7101 is supported by a stand 7103.

The display device of one embodiment of the present invention can be used in the display portion 7000.

The television device 7100 illustrated in FIG. 9A can be operated with an operation switch provided in the housing 7101 or a separate remote controller 7111. Furthermore, the display portion 7000 may include a touch sensor. The television device 7100 can be operated by touching the display portion 7000 with a finger or the like. Furthermore, the remote controller 7111 may be provided with a display portion for displaying data outputted from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 9B:
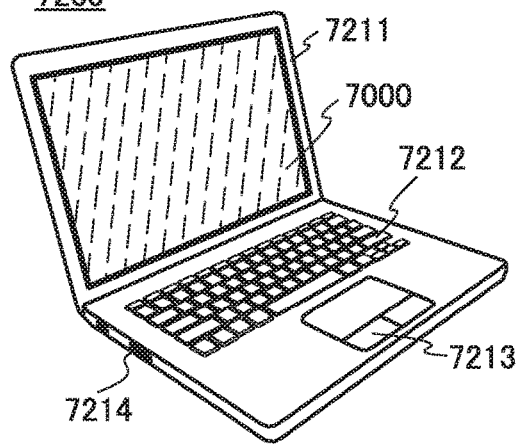

FIG. 9B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 9C:
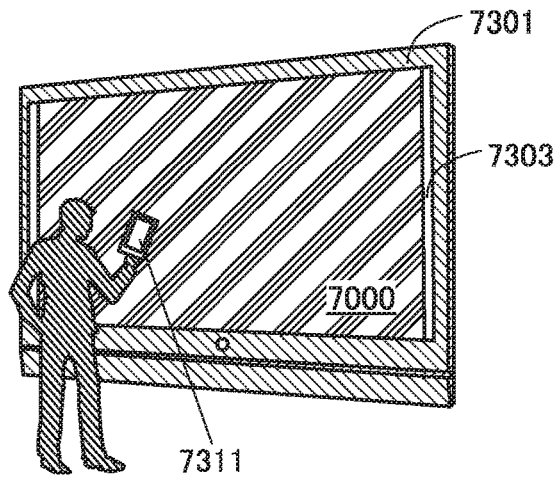
Figure 9D:
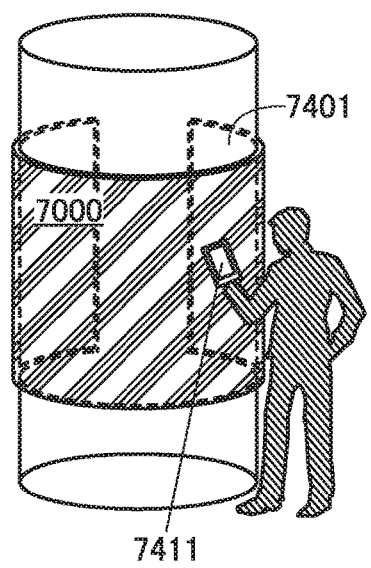

FIGS. 9C and 9D illustrate examples of digital signages.

A digital signage 7300 illustrated in FIG. 9C includes a housing 7301, the display portion 7000, a speaker 7303, and the like. Also, the digital signage can include an LED lamp, operation keys (including a power switch or an operation switch), a connection terminal, a variety of sensors, a microphone, and the like.

FIG. 9D illustrates a digital signage 7400 mounted on a cylindrical pillar 7401. The digital signage 7400 includes the display portion 7000 provided along a curved surface of the pillar 7401.

The display device of one embodiment of the present invention can be used for each of the display portions 7000 illustrated in FIGS. 9C and 9D.

A larger area of the display portion 7000 can provide more information at a time. In addition, the larger display portion 7000 attracts more attention, so that the effectiveness of the advertisement can be increased, for example.

It is preferable to use a touch panel in the display portion 7000 because a device with such a structure does not just display a still or moving image on the display portion 7000, but can be operated by users intuitively. Alternatively, in the case where the display device of one embodiment of the present invention is used for providing information such as route information or traffic information, usability can be enhanced by intuitive operation.

Furthermore, as illustrated in FIGS. 9C and 9D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the portable information terminal 7311 or 7411. Moreover, by operation of the portable information terminal 7311 or 7411, a displayed image on the display portion 7000 can be switched.

Furthermore, it is possible to make the digital signage 7300 or 7400 execute a game with use of the screen of the portable information terminal 7311 or 7411 as an operation means (controller). Thus, an unspecified number of people can join in and enjoy the game concurrently.

FIGS. 10A1, 10A2, and 10B to 10I illustrate examples of portable information terminals including a display portion 7001 having flexibility.

The display portion 7001 is manufactured using the display device of one embodiment of the present invention. For example, a display device including a display panel that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 10A1 and 10A2 are a perspective view and a side view, respectively, illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power on/off, switching of displayed images, and the like can be performed. Although FIGS. 10A1, 10A2, and 10B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 10B illustrates the portable information terminal 7500 in a state where the display portion 7001 is pulled out. Images can be displayed on the display portion 7001 in this state. The display portion 7001 can be extracted with the use of the display portion tab 7502. In addition, the portable information terminal 7500 may perform different displays in the state where part of the display portion 7001 is rolled as illustrated in FIG. 10A1 and in the state where the display portion 7001 is pulled out as illustrated in FIG. 10B. For example, in the state illustrated in FIG. 10A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 10C to 10E illustrate an example of a foldable portable information terminal. FIG. 10C illustrates a portable information terminal 7600 that is opened. FIG. 10D illustrates the portable information terminal 7600 that is being opened or being folded. FIG. 10E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 10F and 10G illustrate an example of a foldable portable information terminal. FIG. 10F illustrates a portable information terminal 7650 that is folded so that the display portion 7001 is on the inside. FIG. 10G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby contamination of or damage to the display portion 7001 can be suppressed.

FIG. 10H illustrates an example of a flexible portable information terminal. A portable information terminal 7700 includes a housing 7701 and the display portion 7001. In addition, the portable information terminal 7700 may include buttons 7703a and 7703b that serve as input means, speakers 7704a and 7704b that serve as sound output means, an external connection port 7705, a microphone 7706, or the like. A flexible battery 7709 can be mounted on the portable information terminal 7700. The battery 7709 may overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 10I illustrates an example of a wrist-watch-type portable information terminal. A portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily curved to have a desired shape.

With the operation button 7803, a variety of functions such as time setting, on/off of the power, on/off of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

This embodiment can be combined with any of other embodiments as appropriate.

EXAMPLE 1

Figure 11:
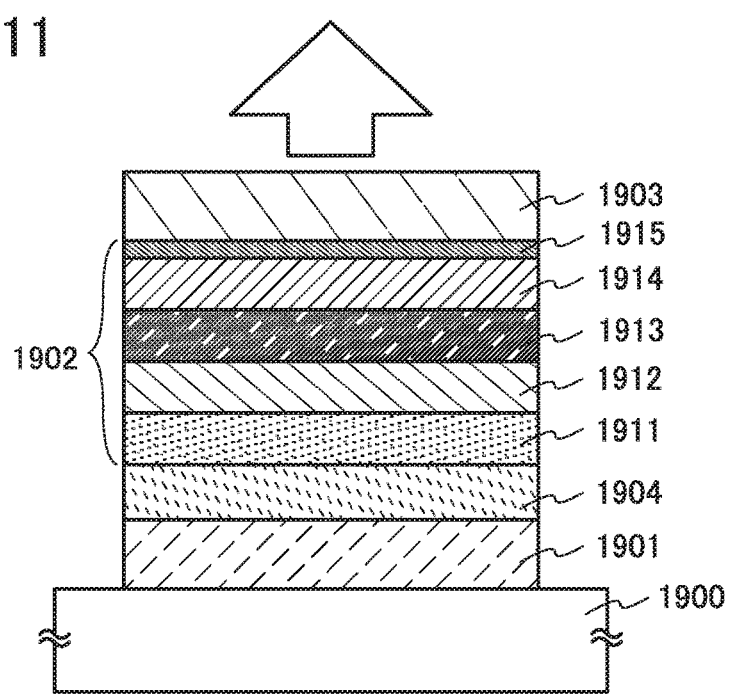
FIG. 11 illustrates a light-emitting element and a comparative light-emitting element in Example 1.

In this example, structures and properties of light-emitting elements that can be used for the display device of one embodiment of the present invention will be described. Note that FIG. 11 illustrates a structure of light-emitting elements and comparative light-emitting elements described in this example, and Table 1 and Table 2 show specific compositions thereof. Structural formulae of materials used in this example are shown below.

[Chemical formula 1]

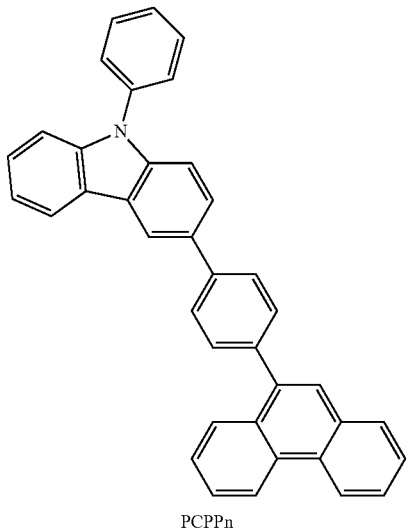

PCPPn

TABLE 1

|  | First electrode | Hole-injection layer | Hole-transport layer | Light-emitting layer | Electron-transport layer | | Electron-injection layer | Second electrode | |
|---|---|---|---|---|---|---|---|---|---|
| Light-emitting element 1(R) | APC\ITSO (10 nm) | PCPPn:MoOx (1:0.5)(7.5 nm) | PCBBiF (15 nm) | * | 2mDBTBPDBq-II (10 nm) | NBPhen (10 nm) | LiF (1 nm) | Ag:Mg (1:0.1) (25 nm) | ITO (70 nm) |
| Light-emitting element 2(G) | APC\ITSO (10 nm) | PCPPn:MoOx (1:0.5)(7.5 nm) | PCBBiF (15 nm) | ** | 2mDBTBPDBq-II (10 nm) | NBPhen (10 nm) | LiF (1 nm) | Ag:Mg (1:0.1) (25 nm) | ITO (70 nm) |
| Light-emitting element 3(B) | APC\ITSO (10 nm) | PCPPn:MoOx (1:0.5)(20 nm) | PCPPn (110 nm) | *** | 2mDBTBPDBq-II (10 nm) | NBPhen (10 nm) | LiF (1 nm) | Ag:Mg (1:0.1) (25 nm) | ITO (70 nm) |

\* 2mDBTBPDBq-II:PCBBiF:[Ir(dmdppr-P)$_2$(dibm)] (0.8:0.2:0.06 (75 nm))
\*\* 2mDBTBPDBq-II:PCBBiF:[Ir(tBuppm)$_3$] (0.8:0.2:0.06 (40 nm))
\*\*\* cgDBCzPA:1,6BnfAPrn-03 (1:0.03 (25 nm))

TABLE 2

|  | First electrode | Hole-injection layer | Hole-transport layer | | Light-emitting layer | Electron-transport layer | | Electron-injection layer | Second electrode | |
|---|---|---|---|---|---|---|---|---|---|---|
| Comparative light-emitting element 11(R) | APC\ITSO (110 nm) | PCPPn:MoOx (1:0.5) (20 nm) | PCPPn (15 nm) | PCBBiF (55 nm) | * | 2mDBTBPDBq-II (10 nm) | NBPhen (10 nm) | LiF (1 nm) | Ag:Mg (1:0.1) (25 nm) | ITO (70 nm) |
| Comparative light-emitting element 12(G) | APC\ITSO (110 nm) | PCPPn:MoOx (1:0.5) (7.5 nm) | PCPPn (15 nm) | PCBBiF (35 nm) | ** | 2mDBTBPDBq-II (10 nm) | NBPhen (10 nm) | LiF (1 nm) | Ag:Mg (1:0.1) (25 nm) | ITO (70 nm) |
| Comparative light-emitting element 13(B) | APC\ITSO (110 nm) | PCPPn:MoOx (1:0.5) (17.5 nm) | PCPPn (15 nm) |  | *** | 2mDBTBPDBq-II (10 nm) | NBPhen (10 nm) | LiF (1 nm) | Ag:Mg (1:0.1) (25 nm) | ITO (70 nm) |

\* 2mDBTBPDBq-II:PCBBiF:[Ir(dmdppr-P)$_2$(dibm)] (0.8:0.2:0.06 (70 nm))
\*\* 2mDBTBPDBq-II:PCBBiF.:[Ir(tBuppm)$_3$] (0.8:0.2:0.06 (40 nm))
\*\*\* cgDBCzPA:1,6BnfAPrn-03 (1:0.03 (25 nm))

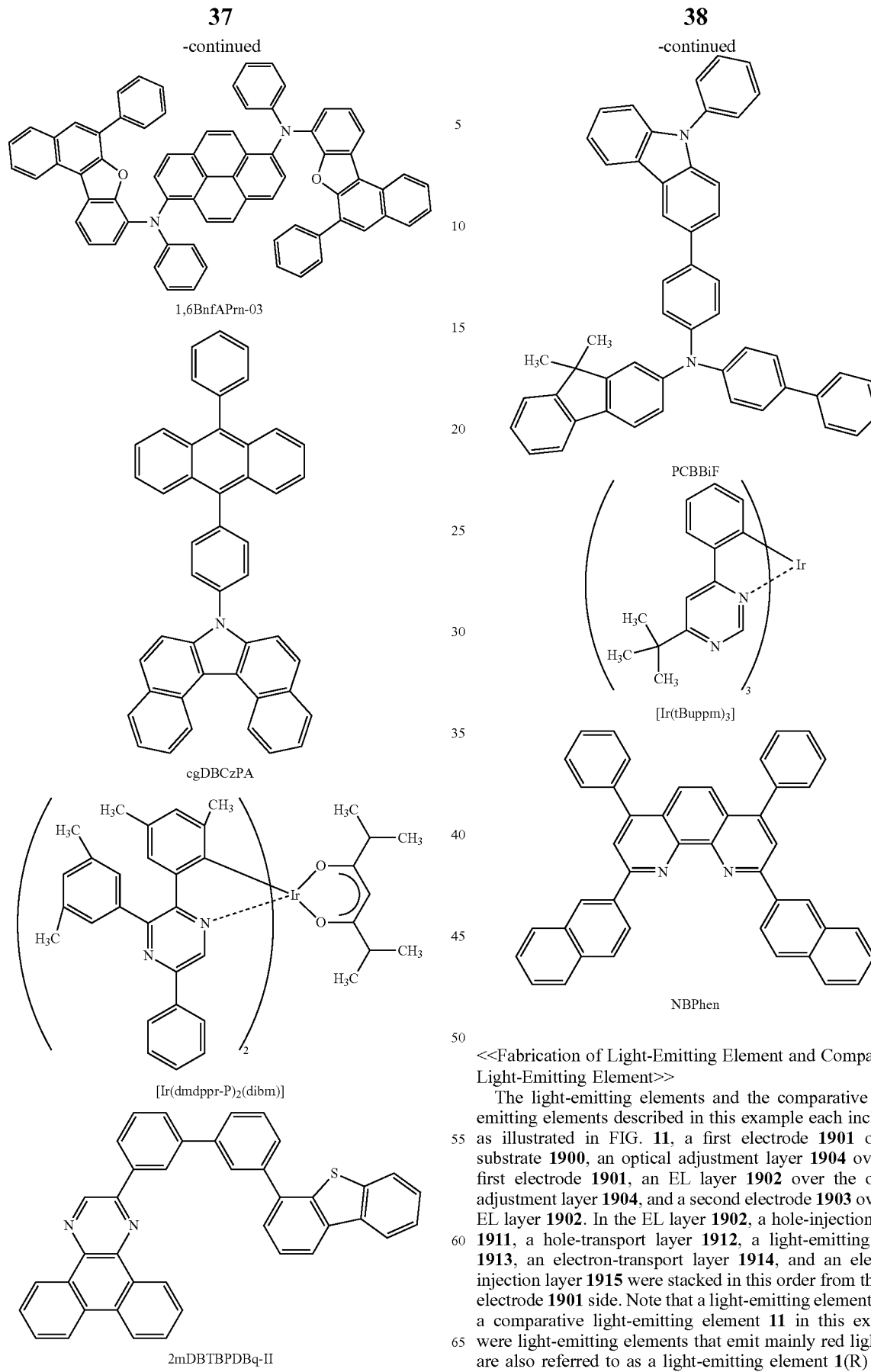

<<Fabrication of Light-Emitting Element and Comparative Light-Emitting Element>>

The light-emitting elements and the comparative light-emitting elements described in this example each included, as illustrated in FIG. 11, a first electrode 1901 over a substrate 1900, an optical adjustment layer 1904 over the first electrode 1901, an EL layer 1902 over the optical adjustment layer 1904, and a second electrode 1903 over the EL layer 1902. In the EL layer 1902, a hole-injection layer 1911, a hole-transport layer 1912, a light-emitting layer 1913, an electron-transport layer 1914, and an electron-injection layer 1915 were stacked in this order from the first electrode 1901 side. Note that a light-emitting element 1 and a comparative light-emitting element 11 in this example were light-emitting elements that emit mainly red light and are also referred to as a light-emitting element 1(R) and a comparative light-emitting element 11(R), respectively. A light-emitting element 2 and a comparative light-emitting element 12 were light-emitting elements that emit mainly green light and are also referred to as a light-emitting element 2(G) and a comparative light-emitting element 12(G), respectively. A light-emitting element 3 and a comparative light-emitting element 13 were light-emitting elements that emit mainly blue light and are also referred to as a light-emitting element 3(B) and a comparative light-emitting element 13(B), respectively.

The light-emitting element in this example had a microcavity structure. The optical length between the electrodes of each of the light-emitting element 1 and the light-emitting element 2 was adjusted to ½ wavelength, and the optical length between the electrodes of each of the light-emitting element 3 and the three comparative light-emitting elements was adjusted to 1 wavelength.

First, the first electrode 1901 was formed over the substrate 1900 and the optical adjustment layer 1904 was formed over the first electrode 1901. A glass substrate was used as the substrate 1900. The area of each of the first electrode 1901 and the optical adjustment layer 1904 was set to 4 mm² (2 mm×2 mm). The first electrode 1901 was formed in the following manner: an alloy film of silver (Ag), palladium (Pd), and copper (Cu) (an Ag—Pd—Cu (APC) film) was formed to a thickness of 200 nm by a sputtering method. As the optical adjustment layer 1904, an ITSO film was formed by a sputtering method. The ITSO film was formed to a thickness of 10 nm for each of the light-emitting elements 1(R), 2(G), and 3(B), and to a thickness of 110 nm for each of the comparative light-emitting elements 11(R), 12(G), and 13(B). In this example, the first electrode 1901 served as an anode and a reflective electrode. The ITSO film was a transparent conductive film.

As pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for about 30 minutes.

Next, the hole-injection layer 1911 was formed over the optical adjustment layer 1904. After the pressure in the vacuum evaporation apparatus was reduced to $10^{-4}$ Pa, the hole-injection layer 1911 was formed by co-evaporation to have the weight ratio of 3-[4-(9-phenanthryl)-phenyl]-9-phenyl-9H-carbazole (abbreviation: PCPPn) to molybdenum oxide of 1:0.5. The hole-injection layer 1911 was formed to a thickness of 7.5 nm for each of the light-emitting elements 1(R) and 2(G) and the comparative light-emitting element 12(G), to a thickness of 20 nm for each of the light-emitting element 3(B) and the comparative light-emitting element 11(R), and to a thickness of 17.5 nm for the comparative light-emitting element 13(B).

Then, the hole-transport layer 1912 was formed over the hole-injection layer 1911.

As the hole-transport layer 1912 of each of the light-emitting elements 1(R) and 2(G), N-(1,1'-biphenyl-4-yl)-N-[4-(9-phenyl-9H-carbazol-3-yl)phenyl]-9,9-dimethyl-9H-fluoren-2-amine (abbreviation: PCBBiF) was deposited by evaporation to a thickness of 15 nm. As the hole-transport layer 1912 of the light-emitting element 3(B), PcPPn was deposited by evaporation to a thickness of 110 nm.

As the hole-transport layer 1912 of each of the comparative light-emitting elements 11(R), 12(G), and 13(B), PCPPn was deposited by evaporation to a thickness of 15 nm. In addition, PCBBiF was deposited thereover by evaporation to a thickness of 55 nm for the comparative light-emitting element 11(R), and to a thickness of 35 nm for the comparative light-emitting element 12(G).

Next, the light-emitting layer 1913 was formed over the hole-transport layer 1912.

As the light-emitting layer 1913 of each of the light-emitting element 1(R) and the comparative light-emitting element 11(R), which were red-light-emitting elements, 2-[3'-(dibenzothiophen-4-yl)biphenyl-3-yl]dibenzo[f,h]quinoxaline (abbreviation: 2mDBTBPDBq-II), PCBBiF, and bis{4,6-dimethyl-2-[3-(3,5-dimethylphenyl)-5-phenyl-2-pyrazinyl-κN]phenyl-κC}(2,6-dimethyl-3,5-heptanedionato-κ²O,O')iridium(III) (abbreviation: [Ir(dmdppr-P)$_2$(dibm)]) were deposited by co-evaporation such that the weight ratio of 2mDBTBPDBq-II to PCBBiF to [Ir(dmdppr-P)$_2$(dibm)] was 0.8:0.2:0.06. The light-emitting layer 1913 was formed to a thickness of 75 nm for the light-emitting element 1(R), and to a thickness of 70 nm for the comparative light-emitting element 11(R).

As the light-emitting layer 1913 of each of the light-emitting element 2(G) and the comparative light-emitting element 12(G), which were green-light-emitting elements, 2mDBTBPDBq-II, PCBBiF, and tris(4-t-butyl-6-phenydinato)iridium(III) (abbreviation: [Ir(tBuppm)$_3$]) were deposited by co-evaporation to a thickness of 40 nm such that the weight ratio of 2mDBTBPDBq-II to PCBBiF to [Ir(tBuppm)$_3$] was 0.8:0.2:0.06.

As the light-emitting layer 1913 of each of the light-emitting element 3(B) and the comparative light-emitting element 13(B), which were blue-light-emitting elements, 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenylbenzo[b]naphtho[1,2-d]furan)-8-amine] (abbreviation: 1,6BnfAPrn-03) were deposited by co-evaporation to a thickness of 25 nm such that the weight ratio of cgDBCzPA to 1,6BnfAPrn-03 was 1:0.03.

The following fabrication steps were common to all the light-emitting elements in this example.

Next, the electron-transport layer 1914 was formed over the light-emitting layer 1913. The electron-transport layer 1914 was formed in the following manner: 2mDBTBPDBq-II and 2,9-bis(naphthalen-2-yl)-4,7-diphenyl-1,10-phenanthroline (abbreviation: NBphen) were sequentially deposited by evaporation to each have a thickness of 10 nm.

Then, the electron-injection layer 1915 was formed over the electron-transport layer 1914. As the electron-injection layer 1915, lithium fluoride (LiF) was deposited by evaporation to a thickness of 1 nm.

Then, the second electrode 1903 was formed over the electron-injection layer 1915 in the following manner: silver (Ag) and magnesium (Mg) were deposited by co-evaporation to a thickness of 25 nm at a volume ratio of Ag to Mg of 1:0.1, and then an indium tin oxide (ITO) was deposited to a thickness of 70 nm by a sputtering method. In this example, the second electrode 1903 served as a cathode. Moreover, the second electrode 1903 was a transflective electrode having functions of transmitting light and reflecting light.

Through the above steps, the light-emitting elements were each formed over the substrate 1900. The hole-injection layer 1911, the hole-transport layer 1912, the light-emitting layer 1913, the electron-transport layer 1914, and the electron-injection layer 1915 described above were functional layers included in the EL layer of one embodiment of the present invention. Furthermore, in all the evaporation steps in the above fabrication method, evaporation was performed by a resistance-heating method.

Each of the light-emitting elements fabricated in this example was sealed between the substrate 1900 and a sealing substrate. The sealing between the substrate 1900 and the sealing substrate was performed in such a manner that the sealing substrate was fixed to the substrate 1900 with a sealing material in a glove box containing a nitrogen atmosphere, a sealant was applied so as to surround the light-emitting element formed over the substrate 1900, and then irradiation with 365-nm ultraviolet light at 6 J/cm² was performed and heat treatment was performed at 80° C. for one hour.

The light-emitting elements fabricated in this example each had a structure in which light was emitted in the direction indicated by an arrow from the second electrode 1903 side of the light-emitting element (FIG. 11).

<<Chromaticity of Light-Emitting Element>>

Next, emission spectra when current at a current density of 2.5 mA/cm² was applied to each light-emitting element fabricated in this example were measured. The emission spectra were measured with a multi-channel spectrometer (PMA-12 produced by Hamamatsu Photonics K. K.). The emission spectrum of the light-emitting element 1(R) had a peak at around 632 nm, the emission spectrum of the light-emitting element 2(G) had a peak at around 523 nm, the emission spectrum of the light-emitting element 3(B) had a peak at around 460 nm, the emission spectrum of the comparative light-emitting element 11(R) had a peak at around 633 nm, the emission spectrum of the comparative light-emitting element 12(G) had a peak at around 523 nm, and the emission spectrum of the comparative light-emitting element 13(B) had a peak at around 459 nm.

The chromaticities (x, y) on the CIE 1931 chromaticity coordinates (x,y chromaticity coordinates) of the light-emitting elements fabricated in this example measured with a luminance colorimeter (BM-5AS manufactured by TOPCON CORPORATION) are shown in Table 3. The chromaticities of the light-emitting elements 1(R), 2(G), and 3(B) and the comparative light-emitting elements 11(R), 12(G), and 13(B) were measured at luminances of 1281 cd/m², 3337 cd/m², 283 cd/m², 1468 cd/m², 4329 cd/m², and 310 cd/m², respectively.

TABLE 3

|  | Chromaticity x | Chromaticity y |
|---|---|---|
| Light-emitting element 1(R) | 0.705 | 0.295 |
| Light-emitting element 2(G) | 0.225 | 0.740 |
| Light-emitting element 3(B) | 0.141 | 0.044 |
| Comparative light-emitting element 11(R) | 0.711 | 0.289 |
| Comparative light-emitting element 12(G) | 0.171 | 0.794 |
| Comparative light-emitting element 13(B) | 0.142 | 0.036 |

The above results show that, in this example, the light-emitting element 1(R) had a chromaticity x of greater than 0.680 and less than or equal to 0.720 and a chromaticity y of greater than or equal to 0.260 and less than or equal to 0.320, the light-emitting element 2(G) had a chromaticity x of greater than or equal to 0.130 and less than or equal to 0.250 and a chromaticity y of greater than 0.710 and less than or equal to 0.810, and the light-emitting element 3(B) had a chromaticity x of greater than or equal to 0.120 and less than or equal to 0.170 and a chromaticity y of greater than or equal to 0.020 and less than 0.060. The light-emitting element 1(R) had a chromaticity x of greater than 0.680 and thus had a better red chromaticity than the DCI-P3 standard. The light-emitting element 2(G) had a chromaticity y of greater than 0.710 and thus had a better green chromaticity than the DCI-P3 standard and the NTSC standard. In addition, the light-emitting element 3(B) had a chromaticity y of less than 0.060 and thus had a better blue chromaticity than the DCI-P3 standard.

Although the chromaticities (x, y) of the light-emitting elements obtained here were chromaticities on the CIE 1931 chromaticity coordinates (x,y chromaticity coordinates), chromaticities on the CIE 1976 chromaticity coordinates (u',v' chromaticity coordinates), which are defined so that the perceived color differences may correspond to distances equivalent in the color space, can be obtained with the use of the following conversion equations (1).

[Formula 1]

$$\left. \begin{array}{l} u' = 4x/(12y - 2x + 3) \\ v' = 9y/(12y - 2x + 3) \end{array} \right\} \quad (1)$$

The chromaticities of the light-emitting elements in this example on the CIE 1976 chromaticity coordinates (u',v' chromaticity coordinates) are listed in Table 4 below. Table 5 shows the chromaticity coordinates in accordance with the BT.2020 standard for comparison.

TABLE 4

|  | Chromaticity u' | Chromaticity v' |
|---|---|---|
| Light-emitting element 1(R) | 0.550 | 0.517 |
| Light-emitting element 2(G) | 0.079 | 0.583 |
| Light-emitting element 3(B) | 0.174 | 0.122 |

TABLE 5

|  | Chromaticity u' | Chromaticity v' |
|---|---|---|
| BT.2020(R) | 0.557 | 0.517 |
| BT.2020(G) | 0.056 | 0.587 |
| BT.2020(B) | 0.159 | 0.126 |

On the basis of the results in Table 4, the BT.2020 area ratio and the BT.2020 coverage calculated from the chromaticities (u', v') are 94% and 92%, respectively. Note that an area A of a triangle formed by connecting the CIE chromaticity coordinates (u', v') of RGB which fulfill the BT.2020 standard and an area B of a triangle formed by connecting the CIE chromaticity coordinates (u', v') of the three light-emitting elements in this example are calculated to obtain the area ratio (B/A). The coverage is a value which represents how much percentage of the BT.2020 standard color gamut (the inside of the above triangle) can be reproduced using a combination of the chromaticities of the three light-emitting elements in this example.

<<Viewing Angle Dependences of Chromaticity and Luminance of Light-Emitting Element>>

Then, viewing angle dependences of the chromaticity and the luminance of the light-emitting element fabricated in this example were calculated.

First, the emission spectra of the light-emitting element in the front direction and the emission spectra of the light-emitting element in the oblique direction were measured. Specifically, a direction perpendicular to a light-emitting surface of the light-emitting element was regarded as 0°, and emission spectra in 17 directions inclined in the range of −80° to 80° (at an interval of 10°) from the front were measured. For the measurement, a multi-channel spectrometer (PMA-12 produced by Hamamatsu Photonics K. K.) was used. From the measurement results, the luminous intensity, the chromaticity (x, y), and the chromaticity (u', v') of the light-emitting element at each angle were obtained.

Then, the luminance of each of the light-emitting elements 1(R), 2(G), and 3(B) when white display (D65, 300 cd/m$^2$) was performed was calculated from the chromaticity (x, y) at 0° (hereinafter, also referred to as front chromaticity). The luminance was regarded as the front luminance of each light-emitting element. Similarly, the luminance of each of the comparative light-emitting elements 11(R), 12(G), and 13(B) when white display (D65, 300 cd/m$^2$) was performed was calculated from the front chromaticity. The luminance was regarded as the front luminance of each comparative light-emitting element.

Next, the luminance ratio of the front luminance to the luminance at each angle was calculated. Here, the luminous intensity ratio at each angle was calculated using the luminous intensity at 0° as a reference, and the luminous intensity ratio was used as the luminance ratio.

The luminance at each angle was calculated from the product of the front luminance and the luminance ratio. The chromaticity of white at each angle was calculated from the values of the luminance and the chromaticity at each angle. In the following description, the case where the light-emitting elements 1(R), 2(G), and 3(B) were used is White display condition 1, and the case where the comparative light-emitting elements 11(R), 12(G), and 13(B) were used is White display comparison condition 2.

<<White Display Condition 1>>

Figure 12:
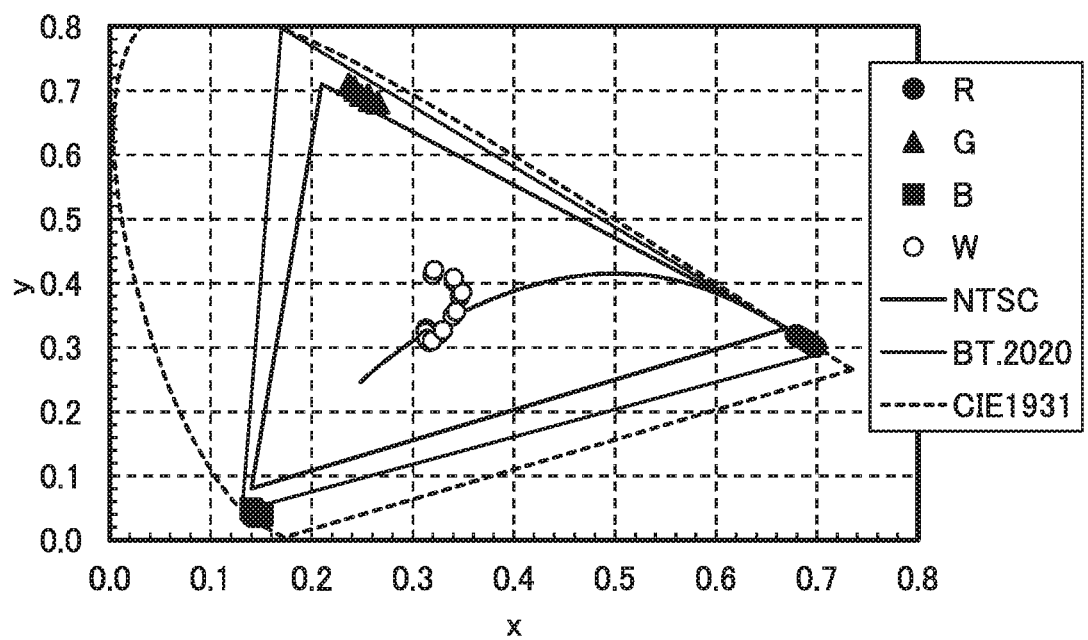
FIG. 12 shows CIE 1931 chromaticity coordinates of light-emitting elements in Example 1.
Figure 13:
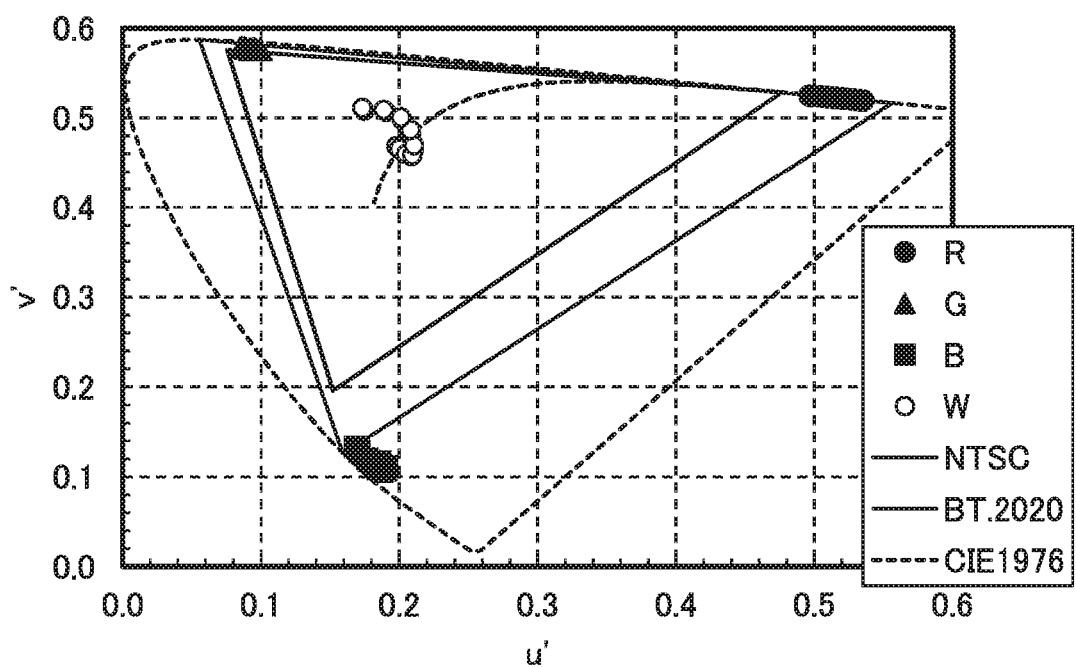
FIG. 13 shows CIE 1976 chromaticity coordinates of light-emitting elements in Example 1.

FIG. 12 and FIG. 13 each show the viewing angle dependence of chromaticity when white display was performed by the light-emitting elements 1(R), 2(G), and 3(B). FIG. 12 shows the chromaticities (x, y) of the light-emitting elements 1(R), 2(G), and 3(B) and white (W) at each angle when white (W) was displayed. Similarly, FIG. 13 shows the chromaticities (u', v') on the CIE 1976 chromaticity coordinates of the light-emitting elements 1(R), 2(G), and 3(B) and white (W) at each angle when white (W) was displayed.

Figure 16:
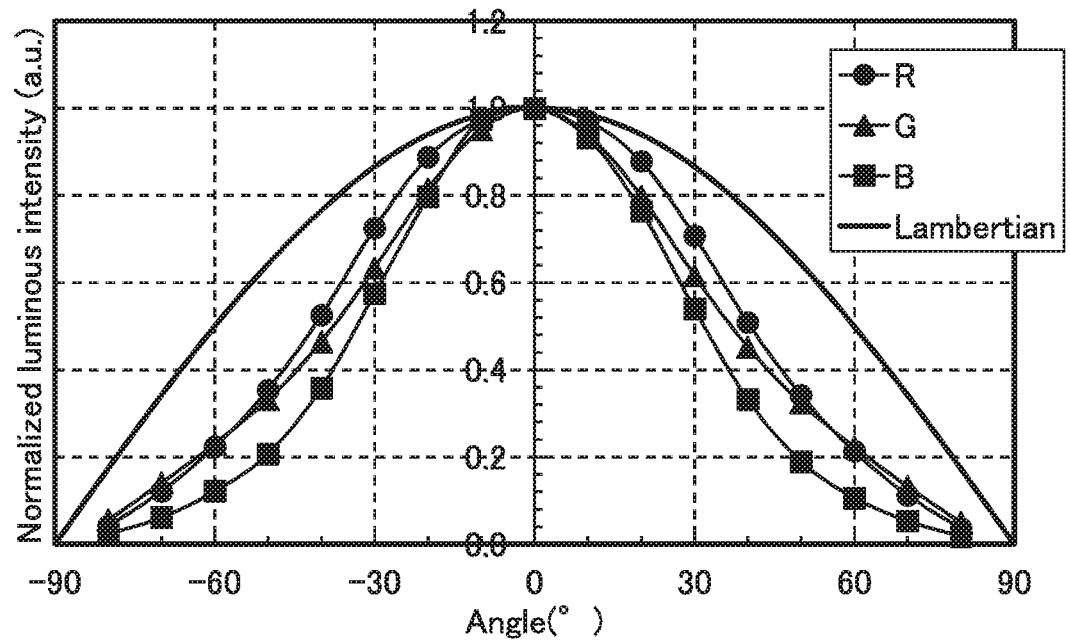
FIG. 16 shows viewing angle dependences of luminances of light-emitting elements in Example 1.
Figure 17:
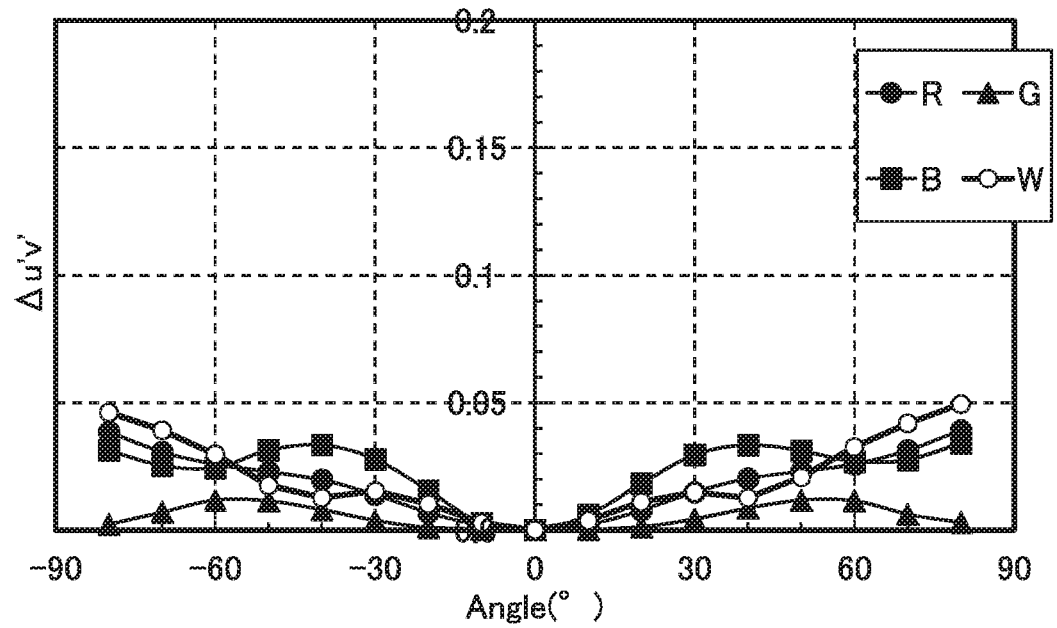
FIG. 17 shows viewing angle dependences of chromaticities of light-emitting elements in Example 1.

FIG. 16 shows the relative luminances of the light-emitting elements 1(R), 2(G), and 3(B) at each angle when the front luminances thereof are used as a reference. In FIG. 16, the luminance at 0° is 1. FIG. 17 shows chromaticity differences Δu'v' on the CIE 1976 chromaticity coordinates between the front chromaticities of the light-emitting elements 1(R), 2(G), and 3(B) and white (W) and the chromaticities thereof at each angle when white (W) was displayed.

<<White Display Comparison Condition 2>>

Figure 14:
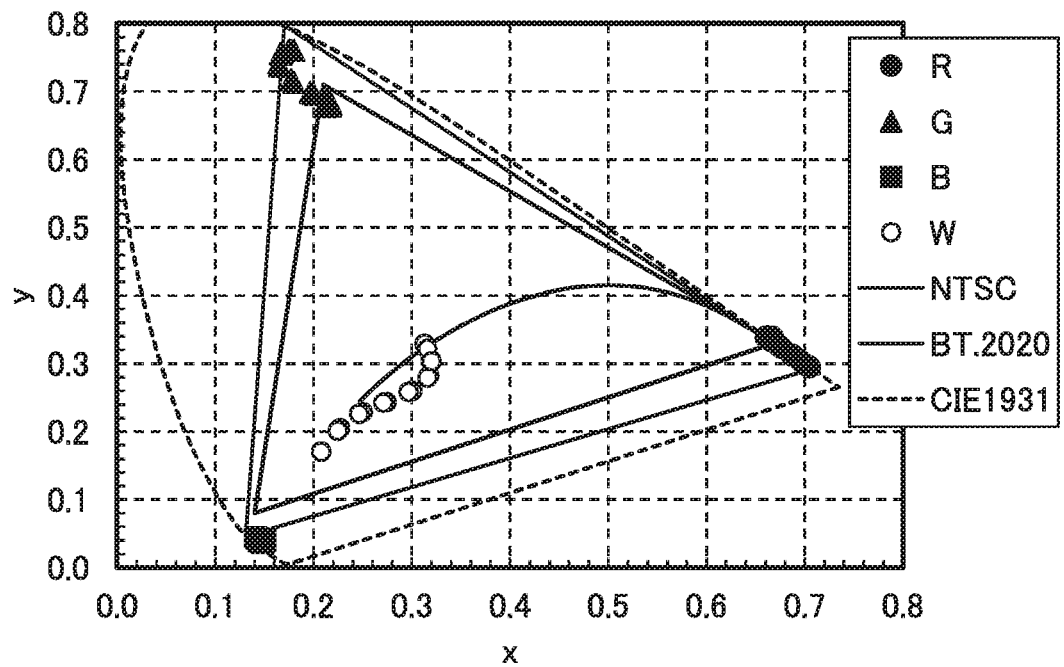
FIG. 14 shows CIE 1931 chromaticity coordinates of comparative light-emitting elements in Example 1.
Figure 15:
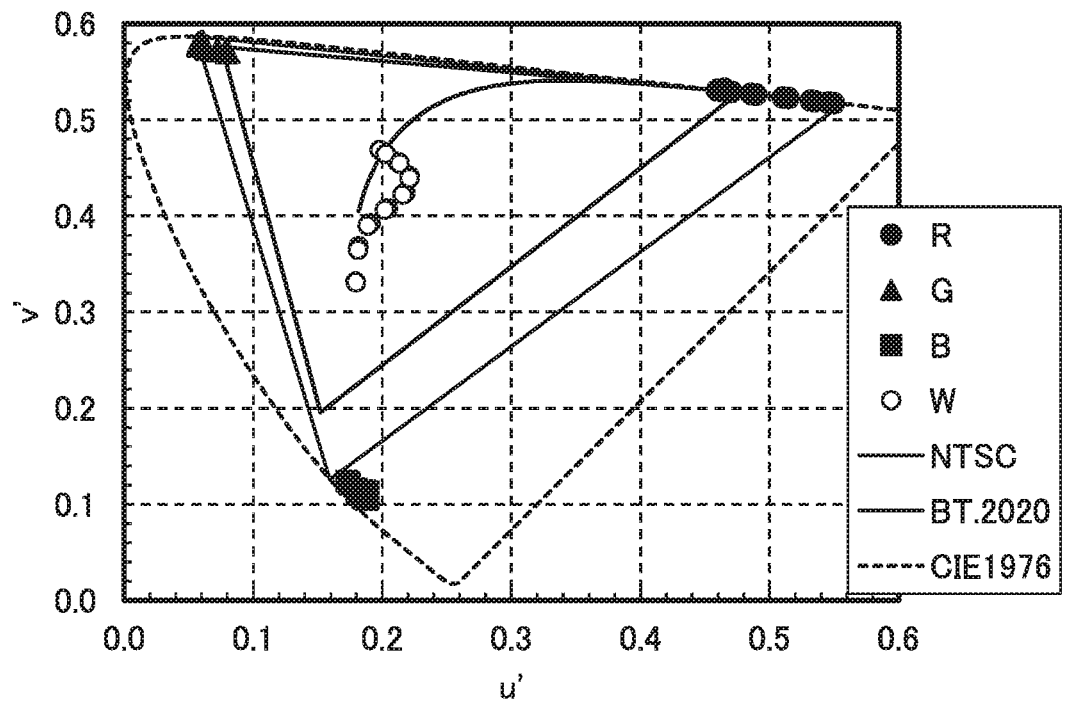
FIG. 15 shows CIE 1976 chromaticity coordinates of comparative light-emitting elements in Example 1.

FIG. 14 and FIG. 15 each show the viewing angle dependence of chromaticity when white display was performed by the comparative light-emitting elements 11(R), 12(G), and 13(B). FIG. 14 shows the chromaticities (x, y) of the comparative light-emitting elements 11(R), 12(G), and 13(B) and white (W) at each angle when white (W) was displayed. Similarly, FIG. 15 shows the chromaticities (u', v') of the comparative light-emitting elements 11(R), 12(G), and 13(B) and white (W) at each angle when white (W) was displayed.

Figure 18:
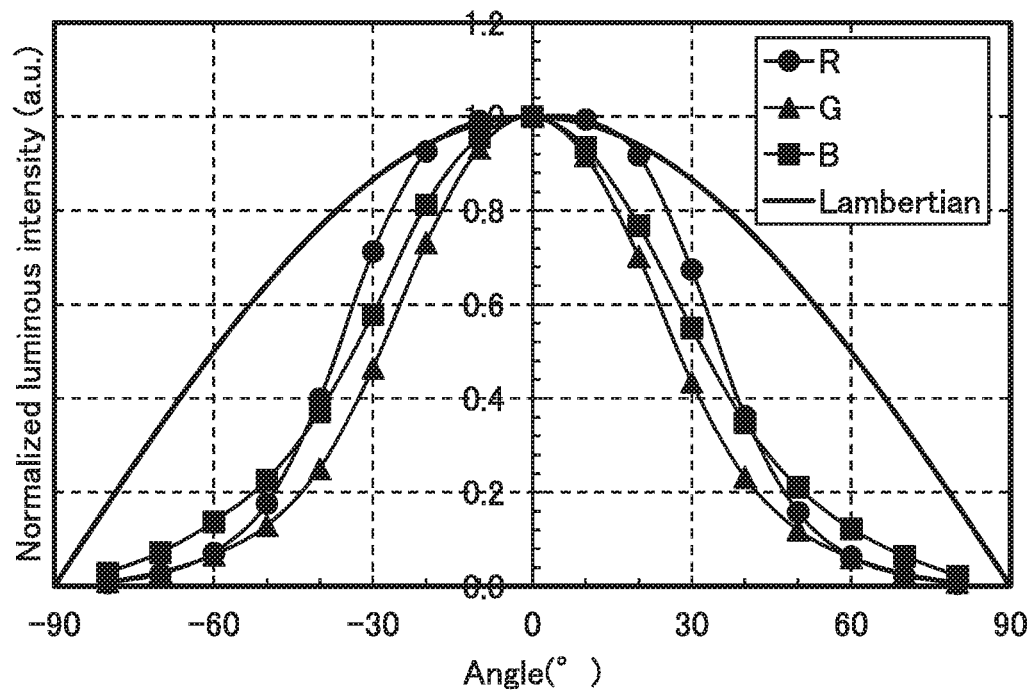
FIG. 18 shows viewing angle dependences of luminances of comparative light-emitting elements in Example 1.
Figure 19:
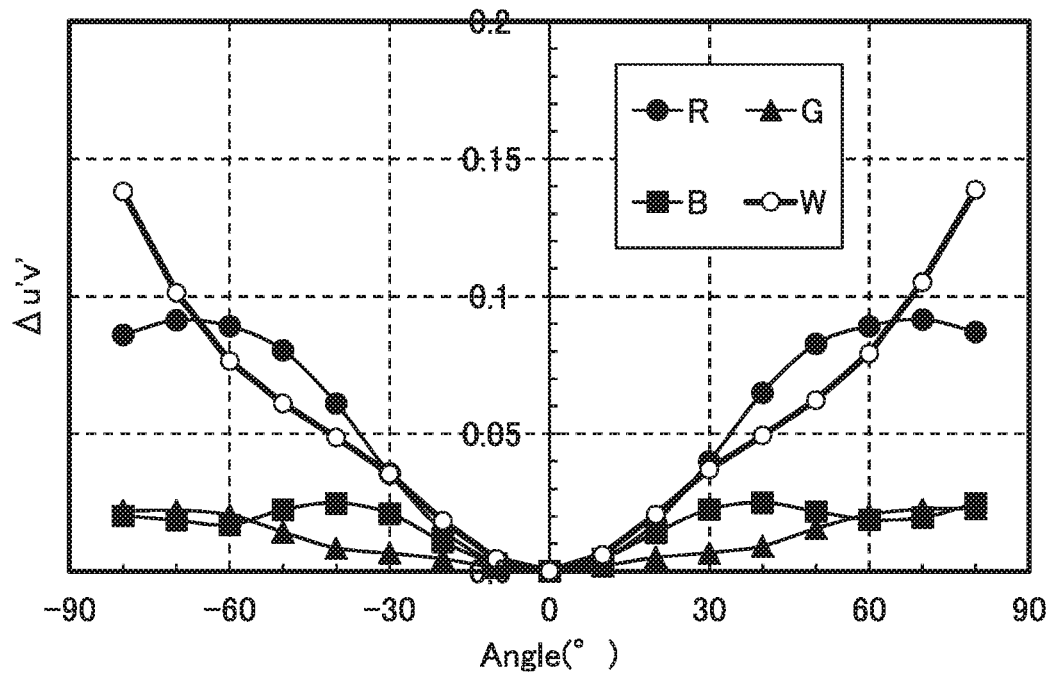
FIG. 19 shows viewing angle dependences of chromaticities of comparative light-emitting elements in Example 1.

FIG. 18 shows the relative luminances of the comparative light-emitting elements 11(R), 12(G), and 13(B) at each angle when the front luminances thereof are used as a reference. In FIG. 18, the luminance at 0° is 1. FIG. 19 shows chromaticity differences Δu'v' on the CIE 1976 chromaticity coordinates between the front chromaticities of the comparative light-emitting elements 11(R), 12(G), and 13(B) and white (W) and the chromaticities thereof at each angle when white (W) was displayed.

These results show that the light-emitting elements (RGB) used for White display condition 1 each had a smaller viewing angle dependence than the comparative light-emitting element of the corresponding color used for White display comparison condition 2 and obtained a favorable emission state even from the oblique direction. In addition, a color shift of white (W) depending on the angle was less in White display condition 1 than in White display comparison condition 2.

Specifically, when FIG. 12 and FIG. 14 are compared and FIG. 13 and FIG. 15 are compared, a change in chromaticity depending on the angle of each of the light-emitting elements (RGB) used for White display condition 1 was smaller than that of the comparative light-emitting element of the corresponding color used for White display comparison condition 2. Moreover, a change in the chromaticity of white (W) depending on the angle was smaller in White display condition 1 than in White display comparison condition 2.

When FIG. 16 and FIG. 18 are compared, the relative luminance of the light-emitting element 1(R) in the range of 30° to 60° was higher than that of the light-emitting element 3(B) in White display condition 1 (FIG. 16). The similar tendency was shown in the range of −60° to −30°. In White display comparison condition 2 (FIG. 18), the relative luminance of the comparative light-emitting element 11(R) at 30° was higher than that of the comparative light-emitting element 13(B); however, the magnitude relation was inverted when the angle increased. Therefore, the relative luminance of the comparative light-emitting element 11(R) at 60° was lower than that of the comparative light-emitting element 13(B). The inversion of the magnitude relation was observed also in the range of −60° to −30°. When the luminance ratio between R, G, and B is changed depending on the angle as in White display comparison condition 2, the chromaticity of white is largely changed. The luminance decay rate of each of the red- and green-light-emitting elements was smaller in White display condition 1 than in White display comparison condition 2. Therefore, the magnitude relation between the relative luminances of the two colors was not inverted depending on the angle in White display condition 1. In this way, the change in the chromaticity of white depending on the angle can be suppressed.

When FIG. 17 and FIG. 19 are compared, a chromaticity difference Δu'v' of the comparative light-emitting element 11(R) in the range of 50° to 80° and −80° to −50° was more than 0.05. On the contrary, a chromaticity difference Δu'v' of the light-emitting element 1(R) was less than 0.05 at any angle; that is, a chromaticity difference Δu'v' between the chromaticity in the oblique direction and the front chromaticity was small. As shown in FIG. 17, chromaticity differences Δu'v' of R, G, B, and W in White display condition 1 were less than 0.05 at any angle; that is, chromaticity differences Δu'v' between the chromaticities in the oblique direction and the front chromaticities were small.

The magnitude relation between the thickness of the red-light-emitting element and the thickness of the blue-light-emitting element (specifically, the magnitude relation between the distance between electrodes of the red-light-emitting element and the distance between electrodes of the blue-light-emitting element) in White display condition 1 was different from that in White display comparison condition 2. In White display condition 1, the light-emitting element 3(B) was thicker than the light-emitting element 1(R). In White display comparison condition 2, the comparative light-emitting element 13(B) was thinner than the comparative light-emitting element 11(R).

In this example, the color purity of light emission of each light-emitting element was increased by using a microcavity structure. In White display comparison condition 2, the thicknesses of the three comparative light-emitting elements (R, G, and B) were each determined so that the optical length between the electrodes becomes 1 wavelength. Meanwhile, in White display condition 1, the thickness of the light-emitting element 3(B) was determined so that the optical length between the electrodes becomes 1 wavelength and the common structure between the light-emitting elements. Note that although the thickness of the hole-injection layer was different between the colors in this example, the hole-injection layers in the light-emitting elements for the three colors may have the same thickness.

These results show that a display device capable of displaying an image with a wide viewing angle and a wide color gamut can be fabricated by using the light-emitting elements described in this example.

EXAMPLE 2

In this example, structures and properties of light-emitting elements that can be used for the display device of one embodiment of the present invention will be described. Note that FIG. 11 illustrates a structure of light-emitting elements described in this example, and Table 6 shows specific compositions thereof. Structural formulae of materials used in this example are shown below. Note that the structural formulae of the materials which are shown above are omitted.

TABLE 6

|  | First electrode | Hole-injection layer | Hole-transport layer | Light-emitting layer | Electron-transport layer |  | Electron-injection layer | Second electrode |  |
| --- | --- | --- | --- | --- | --- | --- | --- | --- | --- |
| Light-emitting element 4(R) | APC\ ITSO (10 nm) | PCzPA:MoOx (1:0.5)(7.5 nm) | PCBBiF (15 nm) | * | 2mDBTBPDBq-II (10 nm) | NBPhen (10 nm) | LiF (1 nm) | Ag:Mg (1:0.1) (25 nm) | ITO (70 nm) |
| Light-emitting element 5(G) | APC\ ITSO (10 nm) | PCzPA:MoOx (1:0.5)(7.5 nm) | PCBBiF (15 nm) | ** | 2mDBTBPDBq-II (10 nm) | NBPhen (10 nm) | LiF (1 nm) | Ag:Mg (1:0.1) (25 nm) | ITO (70 nm) |
| Light-emitting element 6(B) | APC\ ITSO (10 nm) | PCzPA:MoOx (1:0.5)(7.5 nm) | PCzPA (110 nm) | *** | 2mDBTBPDBq-II (10 nm) | NBPhen (10 nm) | LiF (1 nm) | Ag:Mg (1:0.1) (25 nm) | ITO (70 nm) |

* 2mDBTBPDBq-II:PCBBiF:[Ir(dmdppr-P)$_2$(dibm)] (0.8:0.2:0.06 (75 nm))
** 2mDBTBPDBq-II:PCBBiF:[Ir(tBuppm)$_3$] (0.8:0.2:0.06 (40 nm))
*** cgDBCzPA:1,6BnfAPrn-03 (1:0.03 (25 nm))

thicknesses of the light-emitting element 1(R) and the light-emitting element 2(G) were each determined so that the optical length between the electrodes becomes ½ wavelength. With such a structure, the viewing angle dependence of the chromaticity of white was reduced. In particular, since the thickness of the red-light-emitting element was determined so that the optical length between the electrodes is $\lambda/2$, a change in chromaticity and a reduction in luminance depending on the angle were suppressed as compared with the case where the optical length was $\lambda$. As a result, the viewing angle dependence of the chromaticity of white was also reduced.

In this example, the light-emitting element that emits red light, the light-emitting element that emits green light, and the light-emitting element that emits blue light were fabricated. The light-emitting layers of these light-emitting elements were formed using the respective materials and the hole-transport layers were formed to have the respective thicknesses in order to adjust the optical lengths. At the same time, in these light-emitting elements, the electron-transport layers and the electron-injection layers were formed using the same material to have the same thickness; thus, the combination of these light-emitting elements can reduce the number of steps as compared to that in the case where these layers are formed to have structures different between the light-emitting elements. In this manner, the three light-emitting elements achieve wide-range color reproducibility and favorable viewing angle characteristics despite the fact that many kinds of layers in the EL layers each had a

[Chemical Formula 2]

PCzPA

<<Fabrication of Light-Emitting Elements>>

Note that a light-emitting element 4 in this example was a light-emitting element that emits mainly red light and is also referred to as a light-emitting element 4(R). A light-emitting element 5 was a light-emitting element that emits mainly green light and is also referred to as a light-emitting element 5(G). A light-emitting element 6 was a light-emitting element that emits mainly blue light and is also referred to as a light-emitting element 6(B).

The light-emitting element in this example had a microcavity structure. The optical length between electrodes of each of the light-emitting element 4 and the light-emitting element 5 was adjusted to ½ wavelength, and the optical length between electrodes of the light-emitting element 6 was adjusted to 1 wavelength.

Components of the light-emitting element 4(R) other than the hole-injection layer 1911 were fabricated in a manner similar to that of the light-emitting element 1(R) in Example 1. Components of the light-emitting element 5(G) other than the hole-injection layer 1911 were fabricated in a manner similar to that of the light-emitting element 2(G) in Example 1. Components of the light-emitting element 6(B) other than the hole-injection layer 1911 and the hole-transport layer 1912 were fabricated in a manner similar to that of the light-emitting element 3(B) in Example 1. Here, only different steps from the method for fabricating the light-emitting element 1 in Example 1 are described.

After the pressure in the vacuum evaporation apparatus was reduced to $10^{-4}$ Pa, 9-phenyl-3-[4-(10-phenyl-9-anthryl)phenyl]-9H-carbazole (abbreviation: PCzPA) and molybdenum oxide were deposited by co-evaporation with the weight ratio of PCzPA to molybdenum oxide of 1:0.5 to form the hole-injection layer 1911 of each of the light-emitting elements 4(R), 5(G), and 6(B). The hole-injection layer 1911 was formed to a thickness of 7.5 nm.

As the hole-transport layer 1912 of the light-emitting element 6(B), PCzPA was deposited by evaporation to a thickness of 110 nm.

The light-emitting elements fabricated in this example each had a structure in which light was emitted in the direction indicated by an arrow from the second electrode 1903 side of the light-emitting element (FIG. 11).

<<Chromaticity of Light-Emitting Element>>

Next, emission spectra when current at a current density of 2.5 mA/cm$^2$ was applied to each light-emitting element fabricated in this example were measured. The emission spectra were measured with a multi-channel spectrometer (PMA-12 produced by Hamamatsu Photonics K. K.). The emission spectrum of the light-emitting element 4(R) had a peak at around 635 nm, the emission spectrum of the light-emitting element 5(G) had a peak at around 525 nm, and the emission spectrum of the light-emitting element 6(B) had a peak at around 458 nm.

The chromaticities (x, y) on the CIE 1931 chromaticity coordinates (x,y chromaticity coordinates) of the light-emitting elements fabricated in this example measured with a luminance colorimeter (BM-5AS manufactured by TOPCON CORPORATION) are shown in Table 7. The chromaticities of the light-emitting elements 4(R), 5(G), and 6(B) were measured at luminances of 1308 cd/m$^2$, 4392 cd/m$^2$, and 264 cd/m$^2$, respectively.

TABLE 7

|  | Chromaticity x | Chromaticity y |
|---|---|---|
| Light-emitting element 4(R) | 0.707 | 0.293 |
| Light-emitting element 5(G) | 0.222 | 0.747 |
| Light-emitting element 6(B) | 0.142 | 0.034 |

The above results show that, in this example, the light-emitting element 4(R) had a chromaticity x of greater than 0.680 and less than or equal to 0.720 and a chromaticity y of greater than or equal to 0.260 and less than or equal to 0.320, the light-emitting element 5(G) had a chromaticity x of greater than or equal to 0.130 and less than or equal to 0.250 and a chromaticity y of greater than 0.710 and less than or equal to 0.810, and the light-emitting element 6(B) had a chromaticity x of greater than or equal to 0.120 and less than or equal to 0.170 and a chromaticity y of greater than or equal to 0.020 and less than 0.060. The light-emitting element 4(R) had a chromaticity x of greater than 0.680 and thus had a better red chromaticity than the DCI-P3 standard. The light-emitting element 5(G) had a chromaticity y of greater than 0.710 and thus had a better green chromaticity than the DCI-P3 standard and the NTSC standard. In addition, the light-emitting element 6(B) had a chromaticity y of less than 0.060 and thus had a better blue chromaticity than the DCI-P3 standard.

The chromaticities of the light-emitting elements in this example on the CIE 1976 chromaticity coordinates (u',v' chromaticity coordinates) are listed in Table 8 below.

TABLE 8

|  | Chromaticity u' | Chromaticity v' |
|---|---|---|
| Light-emitting element 4(R) | 0.505 | 0.517 |
| Light-emitting element 5(G) | 0.077 | 0.584 |
| Light-emitting element 6(B) | 0.182 | 0.098 |

On the basis of the results in Table 8, the BT.2020 area ratio and the BT.2020 coverage calculated from the chromaticities (u', v') are 100% and 92%, respectively.

The viewing angle dependences of the chromaticity and the luminance of the light-emitting element are affected by the thickness of the light-emitting element. The thickness of the light-emitting element in Example 2 was similar to that of the light-emitting element in Example 1. Therefore, it is suggested that a display device including the light-emitting element in Example 2 can display an image with a wide viewing angle and a wide color gamut as in the case where the display device includes the light-emitting element in Example 1.

<<Initial Characteristics of Light-Emitting Element>>

The light-emitting element 4(R) and the light-emitting element 1(R) in Example 1 had substantially the same initial characteristics. Since the components of the light-emitting element 4(R) other than an organic material used for the hole-injection layer 1911 were similar to those of the light-emitting element 1(R), there might be little influence on the initial characteristics of the light-emitting element 4(R).

The light-emitting element 5(G) and the light-emitting element 2(G) in Example 1 had substantially the same initial characteristics. Since the components of the light-emitting element 5(G) other than the organic material used for the hole-injection layer 1911 were similar to those of the light-emitting element 2(G), there might be little influence on the initial characteristics of the light-emitting element 5(G).

Figure 20:
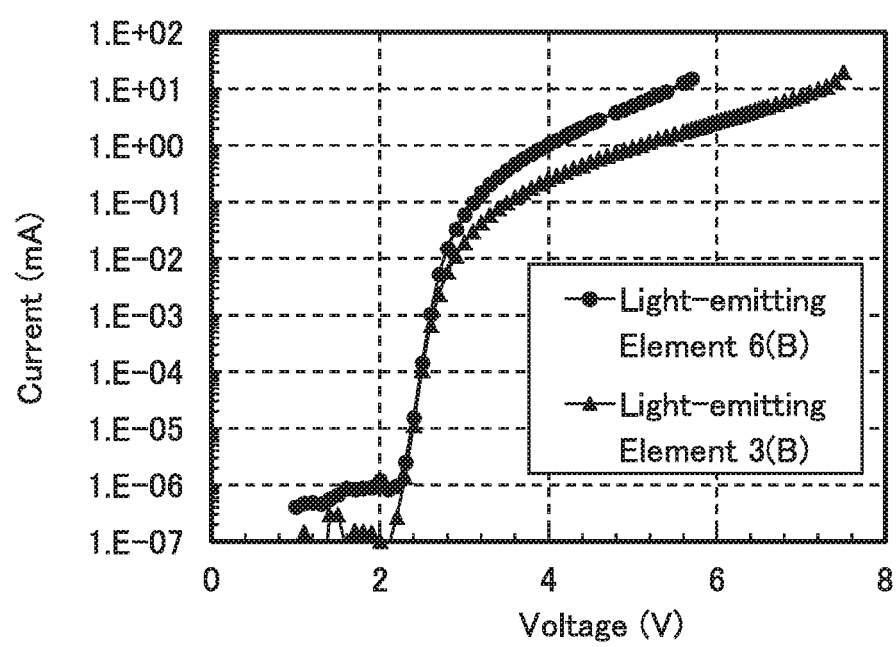
FIG. 20 shows current-voltage characteristics of light-emitting elements.

FIG. 20 shows the current-voltage characteristics of the light-emitting element 6(B). In FIG. 20, the vertical axis represents current (mA), and the horizontal axis represents voltage (V). For comparison, the current-voltage characteristics of the light-emitting element 3(B) fabricated in Example 1 are also shown in FIG. 20.

As shown in FIG. 20, the light-emitting element 6(B) had more favorable current-voltage characteristics and was driven at lower voltage than the light-emitting element 3(B).

As well as the organic material used for the hole-injection layer 1911, a material used for the hole-transport layer 1912 of the light-emitting element 6(B) was different from that of the light-emitting element 3(B). Here, the light-emitting element 6(B) including the thick hole-transport layer 1912 has high driving voltage in some cases. Since the material used for the hole-transport layer 1912 of the light-emitting element 6(B) in this example was different from that of the light-emitting element 3(B), the light-emitting element 6(B) in this example had lower driving voltage than the light-emitting element 3(B).

<<Reliability of Light-Emitting Element>>

Figure 21:
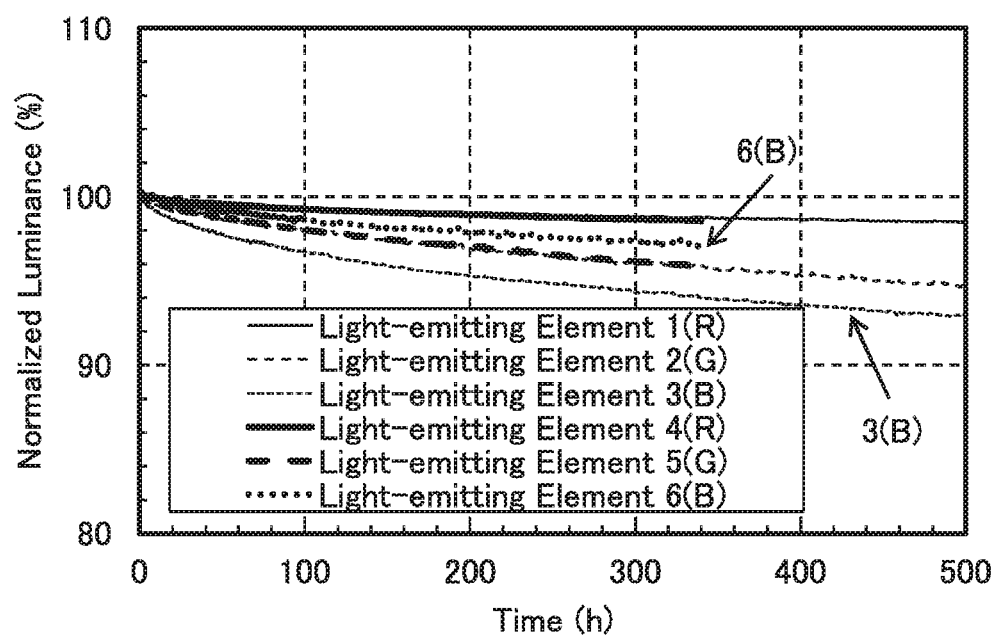
FIG. 21 shows results of reliability tests of light-emitting elements.

FIG. 21 shows the results of the reliability tests of the light-emitting elements 1(R), 2(G), and 3(B) in Example 1 and the light-emitting elements 4(R), 5(G), and 6(B) in this example. In FIG. 21, the vertical axis represents normalized luminance (%) with the initial luminance taken as 100%, and the horizontal axis represents driving time (h) of the element. In the reliability tests, which were conducted at room temperature, the light-emitting elements were driven under the condition where the current value of each light-emitting element was set on the assumption that display is performed under a D65 standard illuminant. The current values of the light-emitting elements 1(R), 2(G), 3(B), 4(R), 5(G), and 6(B) were 0.128 mA, 0.176 mA, 0.328 mA, 0.128 mA, 0.155 mA, and 0.389 mA, respectively.

In FIG. 21, the luminance degradation curves of the light-emitting elements 1(R) and 4(R) were substantially overlapped, and the luminance degradation curves of the light-emitting elements 2(G) and 5(G) were substantially overlapped. In other words, the reliability of the light-emitting element was hardly affected by a change in the organic material used for the hole-injection layer 1911. In addition, it was revealed that the light-emitting element 6(B) had a smaller initial degradation and a longer lifetime than the light-emitting element 3(B).

In this example, the light-emitting element that emits red light, that emits green light, and that emits blue light were fabricated. The light-emitting layers of these light-emitting elements were formed using the respective materials and the hole-transport layers were formed to have the respective thicknesses in order to adjust the optical lengths. At the same time, in these light-emitting elements, the hole-injection layers, the electron-transport layers, and the electron-injection layers were formed using the same material to have the same thickness; thus, the combination of these light-emitting elements can reduce the number of steps as compared to that in the case where these layers are formed to have structures different between the light-emitting elements. In this manner, the three light-emitting elements achieve wide-range color reproducibility despite the fact that many kinds of layers in the EL layers each had a common structure between the light-emitting elements.

Furthermore, in this example, the blue-light-emitting element with low driving voltage and high reliability was achieved while the initial characteristics and the reliability of each of the red-light-emitting element and the green-light-emitting element were kept by changing the organic material used for the hole-injection layer 1911 and the material used for the hole-transport layer 1912 of the blue-light-emitting element in the structure of Example 1.

EXAMPLE 3

In this example, structures and properties of light-emitting elements that can be used for the display device of one embodiment of the present invention will be described. FIG. 11 illustrates a structure of light-emitting elements described in this example, and Table 9 and Table 10 show specific compositions thereof. Note that structural formulae of materials used in this example are already shown.

TABLE 9

| | First electrode | Hole-injection layer | Hole-transport layer | Light-emitting layer | Electron-transport layer | | Electron-injection layer | Second electrode | |
|---|---|---|---|---|---|---|---|---|---|
| Light-emitting element 7(R) | APC\ITSO (10 nm) | PCPPn:MoOx (1:0.5)(Vnm) | PCBBiF (15 nm) | * | 2mDBTBPDBq-II (10 nm) | NBPhen (10 nm) | LiF (1 nm) | Ag:Mg (1:0.1) (Ynm) | ITO (70 nm) |
| Light-emitting element 8(G) | APC\ITSO (10 nm) | PCPPn:MoOx (1:0.5)(Wnm) | PCBBiF (15 nm) | ** | 2mDBTBPDBq-II (10 nm) | NBPhen (10 nm) | LiF (1 nm) | Ag:Mg (1:0.1) (Ynm) | ITO (70 nm) |
| Light-emitting element 9(B) | APC\ITSO (10 nm) | PCPPn:MoOx (1:0.5)(Xnm) | PCPPn (122.5 nm) | *** | 2mDBTBPDBq-II (10 nm) | NBPhen (10 nm) | LiF (1 nm) | Ag:Mg (1:0.1) (Ynm) | ITO (70 nm) |

* 2mDBTBPDBq-II:PCBBiF:[Ir(dmdppr-P)$_2$(dibm)] (0.7:0.3:0.06 (75 nm))
** 2mDBTBPDBq-II:PCBBiF:[Ir(tBuppm)$_3$] (0.8:0.2:0.06 (40 nm))
*** cgDBCzPA:1,6BnfAPrn-03 (1:0.03 (25 nm))
V 7.5 or 10
W 7.5 or 10
X 7.5 or 10
Y 25 or 30 or 35

TABLE 10

| | V | W | X | | | Y |
|---|---|---|---|---|---|---|
| 1 | 7.5 | 7.5 | 7.5 | | 1 | 25 |
| 2 | 7.5 | 7.5 | 10 | × | 2 | 30 |
| 3 | 7.5 | 10 | 7.5 | | 3 | 35 |
| 4 | 7.5 | 10 | 10 | | | |
| 5 | 10 | 7.5 | 7.5 | | | |
| 6 | 10 | 7.5 | 10 | | | |

TABLE 10-continued

| | V | W | X | Y |
|---|---|---|---|---|
| 7 | 10 | 10 | 7.5 | |
| 8 | 10 | 10 | 10 | |

<<Fabrication of Light-Emitting Elements>>

Note that a light-emitting element 7 in this example was a light-emitting element that emits mainly red light and is also referred to as a light-emitting element 7(R). A light-emitting element 8 was a light-emitting element that emits mainly green light and is also referred to as a light-emitting element 8(G). A light-emitting element 9 was a light-emitting element that emits mainly blue light and is also referred to as a light-emitting element 9(B).

The light-emitting element in this example had a microcavity structure. The optical length between electrodes of each of the light-emitting element 7 and the light-emitting element 8 was adjusted to ½ wavelength, and the optical length between electrodes of the light-emitting element 9 was adjusted to 1 wavelength.

As shown in Table 9 and Table 10, there were eight combinations of the thickness (V) of the hole-injection layer 1911 of the light-emitting element 7(R), the thickness (W) of the hole-injection layer 1911 of the light-emitting element 8(G), and the thickness (X) of the hole-injection layer 1911 of the light-emitting element 9(B). Furthermore, there were three patterns of the thickness (Y) of a layer that was formed by co-evaporation of Ag and Mg (hereinafter this layer is also referred to as an Ag:Mg layer) and included in the second electrode 1903 of each of the three light-emitting elements. Accordingly, there were 24 combinations of the light-emitting element 7(R), the light-emitting element 8(G), and the light-emitting element 9(B).

In this example, the power consumption, the color gamut, and the color shift of the light-emitting elements 7(R), 8(G), and 9(B) when white display was performed were evaluated. The color gamut was evaluated by the area ratio with respect to BT.2020 calculated from chromaticity on the CIE 1976 chromaticity coordinates (u',v' chromaticity coordinates). The color shift was evaluated from a chromaticity difference Δu'v' between front chromaticity and chromaticity in a direction inclined 60° from the front.

Figure 22A:
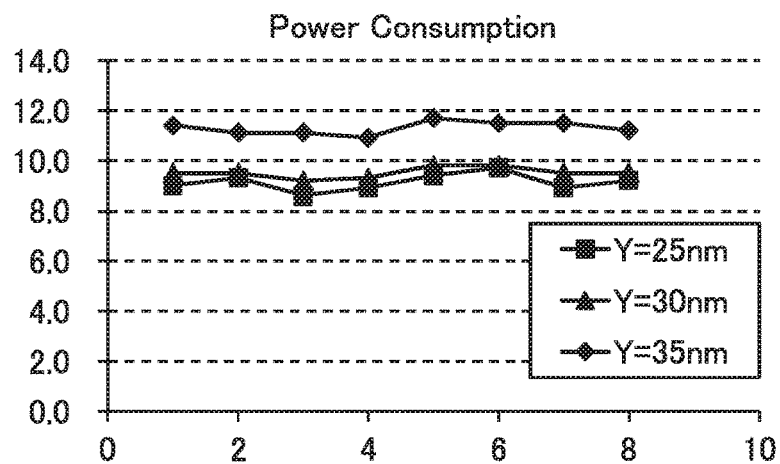
FIGS. 22A to 22C show evaluation results of power consumption of each light-emitting element, the color gamut of each light-emitting element, and a color shift of each light-emitting element.
Figure 22B:
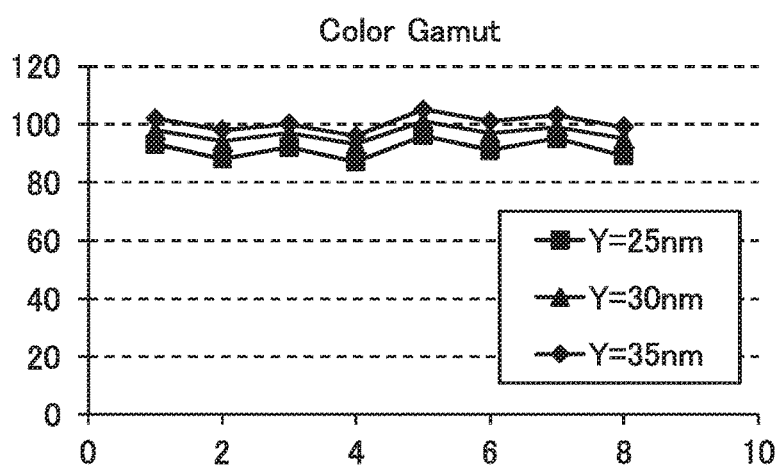
Figure 22C:
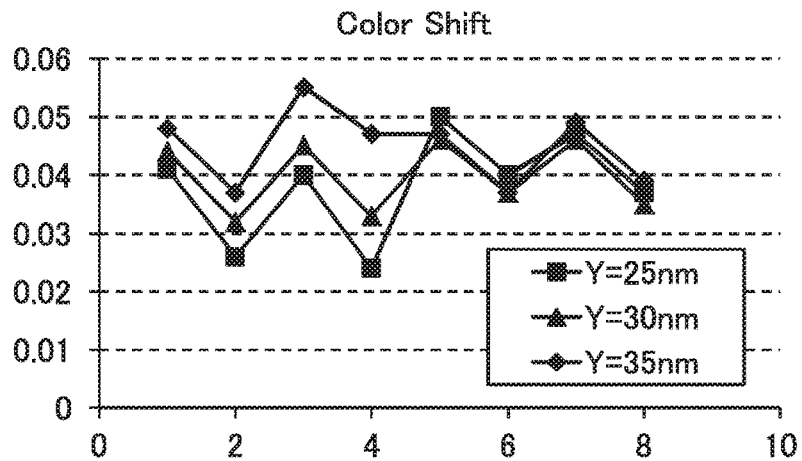

FIGS. 22A to 22C show evaluation results of the power consumption, the color gamut, and the color shift in each combination of the light-emitting elements. According to FIGS. 22A and 22B, as the thickness (Y) of the Ag:Mg layer became large, the power consumption increased but the color gamut became large. As shown in FIG. 22C, a chromaticity difference Δu'v' between the front chromaticity and the chromaticity in a direction inclined 60° from the front was approximately less than or equal to 0.05 in any combination, so that an effect of one embodiment of the present invention was obtained.

This application is based on Japanese Patent Application Serial No. 2017-037256 filed with Japan Patent Office on Feb. 28, 2017, the entire contents of which are hereby incorporated by reference.

What is claimed is:

1. A display device comprising:
   a first light-emitting element;
   a second light-emitting element; and
   a third light-emitting element,
   wherein the first light-emitting element, the second light-emitting element, and the third light-emitting element each comprise a pair of electrodes and a light-emitting layer between the pair of electrodes,
   wherein one of the pair of electrodes comprises a reflective electrode,
   wherein the other of the pair of electrodes comprises a transflective electrode,
   wherein the light-emitting layers of the first light-emitting element, the second light-emitting element, and the third light-emitting element are different from each other,
   wherein a first peak wavelength of an emission spectrum of the first light-emitting element is greater than or equal to 400 nm and less than or equal to 480 nm,
   wherein a second peak wavelength of an emission spectrum of the second light-emitting element is greater than or equal to 580 nm and less than or equal to 700 nm,
   wherein a third peak wavelength of an emission spectrum of the third light-emitting element is between the first peak wavelength and the second peak wavelength,
   wherein a distance between the pair of electrodes of the first light-emitting element is longer than a distance between the pair of electrodes of the second light-emitting element, and
   wherein the distance between the pair of electrodes of the second light-emitting element is longer than a distance between the pair of electrodes of the third light-emitting element.

2. The display device according to claim 1,
   wherein a difference between the distance between the pair of electrodes of the first light-emitting element and the distance between the pair of electrodes of the second light-emitting element is greater than or equal to 40 nm and less than or equal to 90 nm.

3. The display device according to claim 1,
   wherein the first light-emitting element, the second light-emitting element, and the third light-emitting element each comprise a hole-transport layer between the pair of electrodes,
   wherein the hole-transport layer of the first light-emitting element is thicker than the hole-transport layer of the second light-emitting element, and
   wherein the hole-transport layer of the first light-emitting element is thicker than the hole-transport layer of the third light-emitting element.

4. The display device according to claim 1,
   wherein the first light-emitting element, the second light-emitting element, and the third light-emitting element each comprise a transparent electrode between the reflective electrode and the light-emitting layer,
   wherein the transparent electrode of the first light-emitting element is thicker than the transparent electrode of the second light-emitting element, and
   wherein the transparent electrode of the first light-emitting element is thicker than the transparent electrode of the third light-emitting element.

5. The display device according to claim 4,
   wherein the first light-emitting element, the second light-emitting element, and the third light-emitting element each comprise a hole-injection layer and a hole-transport layer between the transparent electrode and the light-emitting layer,
   wherein the first light-emitting element, the second light-emitting element, and the third light-emitting element share the same hole-injection layer, and wherein the first light-emitting element, the second light-emitting element, and the third light-emitting element share the same hole-transport layer.

6. The display device according to claim 1,
wherein the first light-emitting element, the second light-emitting element, and the third light-emitting element each comprise an electron-transport layer between the pair of electrodes, and
wherein the first light-emitting element, the second light-emitting element, and the third light-emitting element share the same electron-transport layer.

7. The display device according to claim 1,
wherein a chromaticity difference Δu'v' on CIE 1976 chromaticity coordinates (u',v' chromaticity coordinates) between a chromaticity of light from the second light-emitting element in a front direction and a chromaticity of light from the second light-emitting element in a direction inclined 60° from a front is less than or equal to 0.05.

8. The display device according to claim 1,
wherein a relative luminance in a direction inclined 30° from the front with respect to front luminance is defined as a first relative luminance and a relative luminance in a direction inclined 60° from a front with respect to the front luminance is defined as a second relative luminance,
wherein the first relative luminance of the second light-emitting element is higher than the first relative luminance of the first light-emitting element, and
wherein the second relative luminance of the second light-emitting element is higher than the second relative luminance of the first light-emitting element.

9. The display device according to claim 1,
wherein the light-emitting layer of the first light-emitting element, the light-emitting layer of the second light-emitting element, and the light-emitting layer of the third light-emitting element are separated from each other.

10. A display device comprising:
a first light-emitting element;
a second light-emitting element; and
a third light-emitting element,
wherein the first light-emitting element, the second light-emitting element, and the third light-emitting element each comprise a pair of electrodes and a light-emitting layer between the pair of electrodes,
wherein one of the pair of electrodes comprises a reflective electrode,
wherein the other of the pair of electrodes comprises a transflective electrode,
wherein the light-emitting layers of the first light-emitting element, the second light-emitting element, and the third light-emitting element are different from each other,
wherein a first peak wavelength of an emission spectrum of the first light-emitting element is greater than or equal to 400 nm and less than or equal to 480 nm,
wherein a second peak wavelength of an emission spectrum of the second light-emitting element is greater than or equal to 580 nm and less than or equal to 700 nm,
wherein a third peak wavelength of an emission spectrum of the third light-emitting element is between the first peak wavelength and the second peak wavelength,
wherein a distance between the pair of electrodes of the first light-emitting element is longer than a distance between the pair of electrodes of the second light-emitting element,
wherein the distance between the pair of electrodes of the second light-emitting element is longer than a distance between the pair of electrodes of the third light-emitting element,
wherein a difference between the distance between the pair of electrodes of the first light-emitting element and the distance between the pair of electrodes of the second light-emitting element is greater than or equal to 40 nm and less than or equal to 90 nm,
wherein the first light-emitting element, the second light-emitting element, and the third light-emitting element each comprise a hole-transport layer between the pair of electrodes,
wherein the hole-transport layer of the first light-emitting element is thicker than the hole-transport layer of the second light-emitting element, and
wherein the hole-transport layer of the first light-emitting element is thicker than the hole-transport layer of the third light-emitting element.

11. The display device according to claim 10,
wherein the first light-emitting element, the second light-emitting element, and the third light-emitting element each comprise an electron-transport layer between the pair of electrodes, and
wherein the first light-emitting element, the second light-emitting element, and the third light-emitting element share the same electron-transport layer.

12. The display device according to claim 10,
wherein a chromaticity difference Δu'v' on CIE 1976 chromaticity coordinates (u',v' chromaticity coordinates) between a chromaticity of light from the second light-emitting element in a front direction and a chromaticity of light from the second light-emitting element in a direction inclined 60° from a front is less than or equal to 0.05.

13. The display device according to claim 10,
wherein a relative luminance in a direction inclined 30° from the front with respect to front luminance is defined as a first relative luminance and a relative luminance in a direction inclined 60° from a front with respect to the front luminance is defined as a second relative luminance,
wherein the first relative luminance of the second light-emitting element is higher than the first relative luminance of the first light-emitting element, and
wherein the second relative luminance of the second light-emitting element is higher than the second relative luminance of the first light-emitting element.

14. The display device according to claim 10,
wherein the light-emitting layer of the first light-emitting element, the light-emitting layer of the second light-emitting element, and the light-emitting layer of the third light-emitting element are separated from each other.

15. A display device comprising:
a first light-emitting element;
a second light-emitting element; and
a third light-emitting element,
wherein the first light-emitting element, the second light-emitting element, and the third light-emitting element each comprise a pair of electrodes and a light-emitting layer between the pair of electrodes, wherein one of the pair of electrodes comprises a reflective electrode, wherein the other of the pair of electrodes comprises a transflective electrode, wherein the light-emitting layers of the first light-emitting element, the second light-emitting element, and the third light-emitting element are different from each other, wherein a first peak wavelength of an emission spectrum of the first light-emitting element is greater than or equal to 400 nm and less than or equal to 480 nm, wherein a second peak wavelength of an emission spectrum of the second light-emitting element is greater than or equal to 580 nm and less than or equal to 700 nm, wherein a third peak wavelength of an emission spectrum of the third light-emitting element is between the first peak wavelength and the second peak wavelength, wherein a distance between the pair of electrodes of the first light-emitting element is longer than a distance between the pair of electrodes of the second light-emitting element, wherein the distance between the pair of electrodes of the second light-emitting element is longer than a distance between the pair of electrodes of the third light-emitting element, wherein a difference between the distance between the pair of electrodes of the first light-emitting element and the distance between the pair of electrodes of the second light-emitting element is greater than or equal to 40 nm and less than or equal to 90 nm, wherein the first light-emitting element, the second light-emitting element, and the third light-emitting element each comprise a transparent electrode between the reflective electrode and the light-emitting layer, wherein the transparent electrode of the first light-emitting element is thicker than the transparent electrode of the second light-emitting element, and wherein the transparent electrode of the first light-emitting element is thicker than the transparent electrode of the third light-emitting element.

16. The display device according to claim 15, wherein the first light-emitting element, the second light-emitting element, and the third light-emitting element each comprise a hole-injection layer and a hole-transport layer between the transparent electrode and the light-emitting layer, wherein the first light-emitting element, the second light-emitting element, and the third light-emitting element share the same hole-injection layer, and wherein the first light-emitting element, the second light-emitting element, and the third light-emitting element share the same hole-transport layer.

17. The display device according to claim 15, wherein the first light-emitting element, the second light-emitting element, and the third light-emitting element each comprise an electron-transport layer between the pair of electrodes, and wherein the first light-emitting element, the second light-emitting element, and the third light-emitting element share the same electron-transport layer.

18. The display device according to claim 15, wherein a chromaticity difference Δu'v' on CIE 1976 chromaticity coordinates (u',v' chromaticity coordinates) between a chromaticity of light from the second light-emitting element in a front direction and a chromaticity of light from the second light-emitting element in a direction inclined 60° from a front is less than or equal to 0.05.

19. The display device according to claim 15, wherein a relative luminance in a direction inclined 30° from the front with respect to front luminance is defined as a first relative luminance and a relative luminance in a direction inclined 60° from a front with respect to the front luminance is defined as a second relative luminance, wherein the first relative luminance of the second light-emitting element is higher than the first relative luminance of the first light-emitting element, and wherein the second relative luminance of the second light-emitting element is higher than the second relative luminance of the first light-emitting element.

20. The display device according to claim 15, wherein the light-emitting layer of the first light-emitting element, the light-emitting layer of the second light-emitting element, and the light-emitting layer of the third light-emitting element are separated from each other.

* * * * *